(12) United States Patent
Jeon et al.

(10) Patent No.: US 10,930,749 B2
(45) Date of Patent: Feb. 23, 2021

(54) SEMICONDUCTOR DEVICES HAVING A GATE ISOLATION LAYER AND METHODS OF MANUFACTURING THE SAME

(71) Applicant: Samsung Electronics Co., Ltd., Suwon-si (KR)

(72) Inventors: Yong Ho Jeon, Hwaseong-si (KR); Jung Hyun Kim, Hwaseong-si (KR); Sung Woo Myung, Hwaseong-si (KR); Young Mook Oh, Hwaseong-si (KR); Dong Seok Lee, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/232,369

(22) Filed: Dec. 26, 2018

(65) Prior Publication Data

US 2019/0378903 A1 Dec. 12, 2019

(30) Foreign Application Priority Data

Jun. 12, 2018 (KR) .................. 10-2018-0067407

(51) Int. Cl.
| | | |
|---|---|---|
| H01L 29/423 | (2006.01) | |
| H01L 21/763 | (2006.01) | |
| H01L 21/8234 | (2006.01) | |
| H01L 27/088 | (2006.01) | |
| H01L 21/764 | (2006.01) | |

(52) U.S. Cl.
CPC ...... *H01L 29/42368* (2013.01); *H01L 21/764* (2013.01); *H01L 21/823481* (2013.01); *H01L 27/0886* (2013.01)

(58) Field of Classification Search
None
See application file for complete search history.

(56) References Cited

U.S. PATENT DOCUMENTS

| | | |
|---|---|---|
| 9,123,774 B2 | 9/2015 | Suk et al. |
| 9,508,727 B2 | 11/2016 | Park et al. |
| 9,553,090 B2 | 1/2017 | Chang et al. |
| 9,553,171 B2 | 1/2017 | Chang et al. |
| 9,559,184 B2 | 1/2017 | Ching et al. |
| 9,601,567 B1 | 3/2017 | Hsieh |
| 9,673,293 B1 | 6/2017 | Cheng et al. |
| 9,679,985 B1 | 6/2017 | Wu et al. |
| 9,768,170 B2 | 9/2017 | Chang et al. |
| 9,806,166 B2 | 10/2017 | Myung et al. |
| 9,818,879 B2 | 11/2017 | Park et al. |
| 9,847,330 B2 | 12/2017 | Chang et al. |
| 9,899,267 B1 | 2/2018 | Liou et al. |
| 2012/0037975 A1* | 2/2012 | Cho .................. H01L 29/42336 257/321 |
| 2016/0133632 A1* | 5/2016 | Park ................ H01L 21/823828 257/369 |

(Continued)

*Primary Examiner* — Khaja Ahmad
(74) *Attorney, Agent, or Firm* — Myers Bigel, P.A.

(57) ABSTRACT

Semiconductor devices are provided. A semiconductor device includes a channel region that protrudes from a substrate. The semiconductor device includes a gate line on the channel region. Moreover, the semiconductor device includes a gate isolation layer that is between a first portion of the gate line and a second portion of the gate line. The gate isolation layer is in contact with the gate line and includes a gap that is in the gate isolation layer. Related methods of manufacturing a semiconductor device are also provided.

20 Claims, 16 Drawing Sheets

(56) References Cited

U.S. PATENT DOCUMENTS

| | | |
|---|---|---|
| 2017/0154968 A1 | 6/2017 | Park et al. |
| 2017/0229451 A1* | 8/2017 | Chang ............... H01L 29/66545 |
| 2017/0229452 A1* | 8/2017 | Chang ............... H01L 29/0649 |
| 2018/0108770 A1* | 4/2018 | Cheng ................. H01L 29/785 |
| 2019/0006345 A1* | 1/2019 | Wang .............. H01L 21/823481 |
| 2019/0148215 A1* | 5/2019 | Chang ................ H01L 27/0924 |
| | | 257/369 |
| 2019/0148539 A1* | 5/2019 | Yang .................. H01L 27/0886 |
| | | 257/401 |
| 2019/0165155 A1* | 5/2019 | Chang ............ H01L 21/823481 |
| 2019/0252268 A1* | 8/2019 | Xie ................ H01L 21/823821 |

\* cited by examiner

SEMICONDUCTOR DEVICES HAVING A GATE ISOLATION LAYER AND METHODS OF MANUFACTURING THE SAME

CROSS-REFERENCE TO RELATED APPLICATION

This application claims the benefit of Korean Patent Application No. 10-2018-0067407, filed on Jun. 12, 2018, the disclosure of which is hereby incorporated herein by reference in its entirety.

BACKGROUND

The present disclosure relates to semiconductor devices and methods of manufacturing the same. As the integration density of semiconductor devices has increased, fin field-effect transistors (FinFETs) having three-dimensional (3D) structures, which may supersede two-dimensional (2D) transistors, have been developed to overcome the limitations of FETs of the related art. In addition, to protect a gate insulating layer that is vulnerable to a subsequent annealing process, a replacement metal gate (RMG) process by which a dummy gate electrode is formed and then a gate electrode is formed has recently been used. A gate isolation layer configured to separate a gate line may be disposed in a FinFET. With the downscaling of semiconductor devices to achieve high integration, capacitance due to the gate isolation layer may undesirably increase.

SUMMARY

Example embodiments of the inventive concepts are directed to providing a semiconductor device including a gate line formed using a replacement metal gate (RMG) process, in which a gate isolation layer includes an air gap to reduce a capacitance.

In addition, example embodiments of the inventive concepts are directed to providing a semiconductor device in which a middle critical dimension (MCD) of a gate isolation layer is greater than a top critical dimension (TCD) thereof.

Further, example embodiments of the inventive concepts are directed to providing a method of manufacturing a semiconductor device in which a gate isolation layer includes an air gap.

A semiconductor device, according to example embodiments, may include a first channel region and a second channel region that protrude from a substrate and that extend in a first direction. The semiconductor device may include a first gate on the first channel region. The semiconductor device may include a second gate on the second channel region. The first gate and the second gate may extend in a second direction intersecting the first direction and may be spaced apart from each other in the second direction. The semiconductor device may include a first gate insulating layer between the first gate and the first channel region. The semiconductor device may include a second gate insulating layer between the second gate and the second channel region. Moreover, the semiconductor device may include a gate isolation layer between the first gate and the second gate. The gate isolation layer may be in contact with the first gate and the second gate and may include a gap that is in the gate isolation layer. A first width of the gate isolation layer in the second direction may be greater than a second width of the gate isolation layer in the second direction. A third width of the gate isolation layer in the second direction may be less than the first width of the gate isolation layer. The first width may be between the second width and the third width in a third direction that is perpendicular to the first direction and the second direction.

A semiconductor device, according to example embodiments, may include a substrate including a channel region that protrudes from the substrate. The semiconductor device may include a gate line on a first side surface and a second side surface of the channel region. The semiconductor device may include gate spacers on a first side surface and a second side surface of the gate line. Moreover, the semiconductor device may include a gate isolation layer in a gate cut region that separates a first portion of the gate line from a second portion of the gate line. The gate isolation layer may be in contact with the gate line and may include a gap that is in the gate isolation layer. A first width of the gap may be greater than a second width of the gap. A third width of the gap may be narrower than the first width. The first width may be between the second width and the third width.

A semiconductor device, according to example embodiments, may include a substrate including a channel region that protrudes from the substrate and that extends in a first direction. The semiconductor device may include a first gate line and a second gate line that are on the channel region and that extend in a second direction intersecting the first direction. The first gate line may be spaced apart from the second gate line in the first direction. The semiconductor device may include gate spacers on a first side surface and a second side surface of the first gate line. The semiconductor device may include a gate insulating layer between the first gate line and the gate spacers. The semiconductor device may include a gate isolation layer in a gate cut region that is between the first gate line and the second gate line in the first direction. Moreover, the semiconductor device may include a gap in the gate isolation layer. The gate cut region may separate the first gate line, separate the gate insulating layer, and separate the gate spacers. The gate isolation layer may be in contact with the first gate line. A first width of the gate isolation layer may be greater than, and located between, a second width and a third width of the gate isolation layer.

A method of manufacturing a semiconductor device, according to example embodiments, may include forming a plurality of channel regions and a device isolation layer. The plurality of channel regions may protrude from a substrate, and the device isolation layer may be in a trench between the plurality of channel regions. The method may include forming a dummy gate structure on the plurality of channel regions and the device isolation layer. The method may include forming an interlayer insulating layer on the plurality of channel regions and the device isolation layer, on a first side and a second side of the dummy gate structure. The method may include removing the dummy gate structure to form a gate opening. The method may include forming a gate structure including a gate line in the gate opening. The method may include forming a gate cut region separating the gate line into a plurality of gates. Moreover, the method may include forming a gate isolation layer in the gate cut region. The gate isolation layer may include a gap that is in the gate isolation layer.

BRIEF DESCRIPTION OF THE DRAWINGS

FIGS. 9 to 28 are cross-sectional views and plan views according to sequential process operations for describing a method of manufacturing a semiconductor device according to some example embodiments, wherein FIGS. 12 to 14 are cross-sectional views taken along lines I-I', II-II', and III-III' of FIG. 11, respectively, FIGS. 16 to 18 are cross-sectional views taken along lines I-I', II-II', and III-III' of FIG. 15, respectively, FIGS. 20 and 21 are cross-sectional views taken along lines I-I' and III-III' of FIG. 19, respectively, FIGS. 23 and 24 are cross-sectional views taken along lines I-I' and III-III' of FIG. 22, respectively, and FIGS. 26 and 27 are cross-sectional views taken along lines I-I' and III-III' of FIG. 25, respectively.

DETAILED DESCRIPTION

Figure 1:
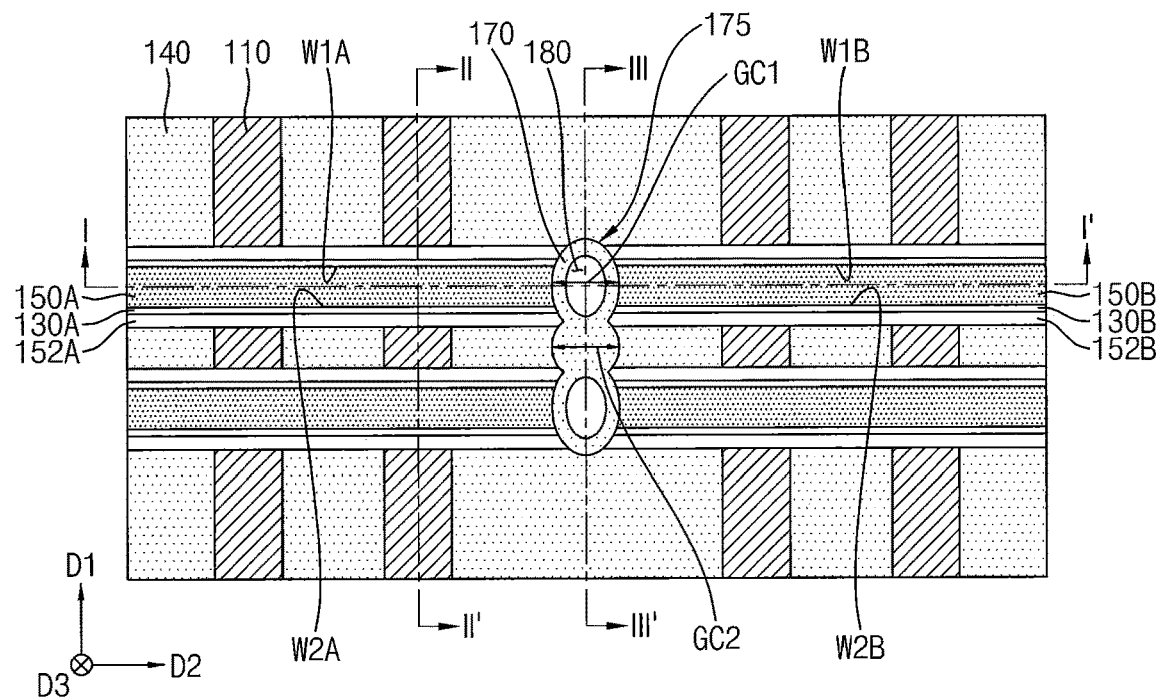
FIG. 1 is a plan view of main components of a semiconductor device according to some example embodiments.
Figure 2:
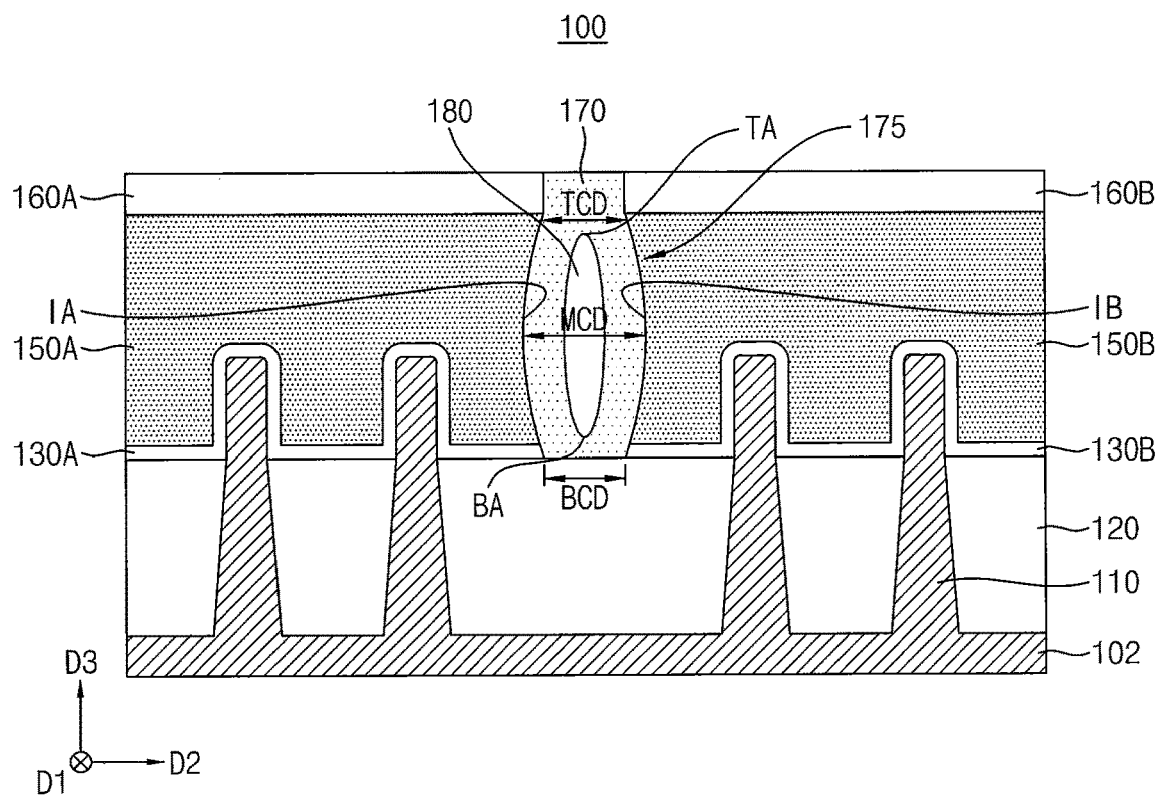
FIG. 2 is a cross-sectional view taken along line I-I' of the plan view of FIG. 1.
Figure 3:
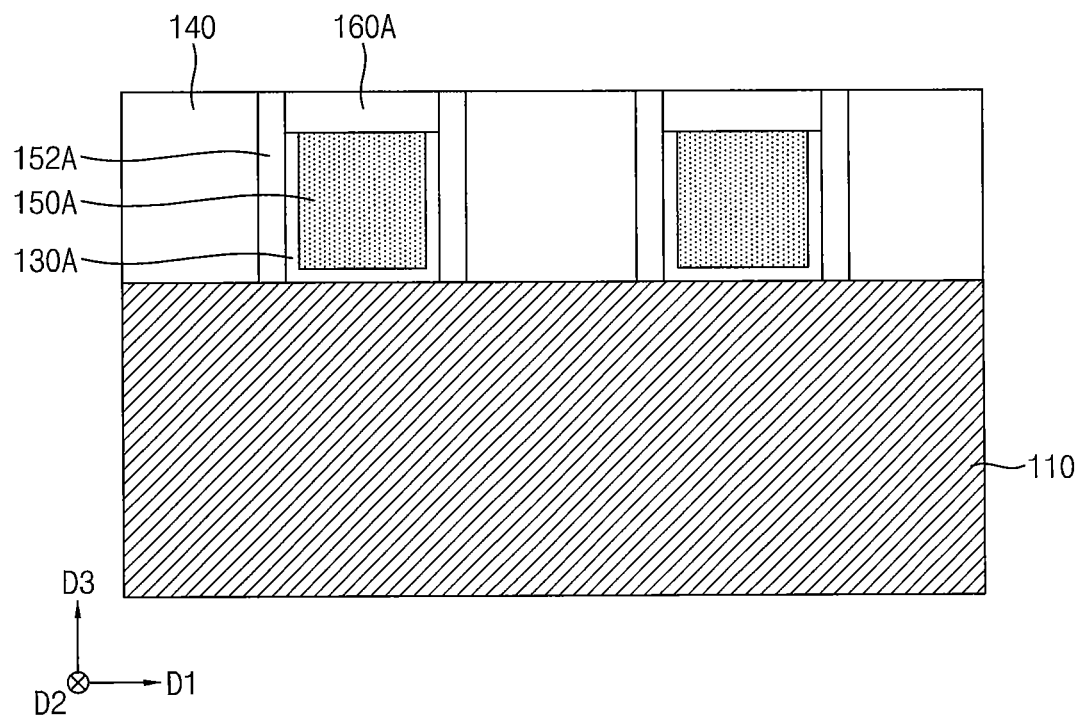
FIG. 3 is a cross-sectional view taken along line II-II' of the plan view of FIG. 1.
Figure 4:
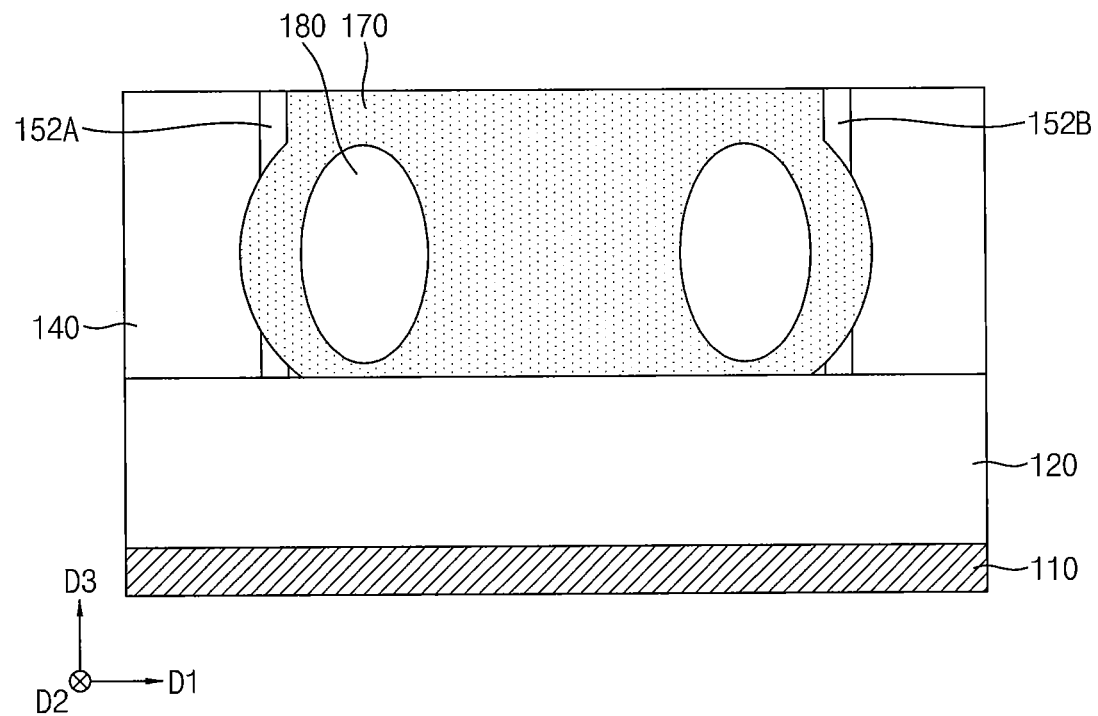
FIG. 4 is a cross-sectional view taken along line III-III' of the plan view of FIG. 1.

FIG. 1 is a plan view of main components of a semiconductor device 100 according to some example embodiments, and FIGS. 2 to 4 are cross-sectional views taken along lines I-I', II-II', and III-III' of FIG. 2, respectively.

Referring to FIGS. 1 to 4, the semiconductor device 100 of the inventive concepts may include a substrate 102, a channel pattern 110 (e.g., a channel region), and a device isolation layer 120. Further, the semiconductor device 100 may include a first gate insulating layer 130A, a second gate insulating layer 130B, an interlayer insulating layer 140, a first gate 150A, a second gate 150B, a first capping layer 160A, and a second capping layer 160B on the channel pattern 110 and the device isolation layer 120. The semiconductor device 100 of the inventive concepts may further include a gate isolation layer 170 and an air gap 180. The semiconductor device 100 according to example embodiments of the inventive concepts may include a fin field-effect transistor (FinFET). The FinFET may be an NMOS transistor or a PMOS transistor.

Hereinafter, a first direction D1 will refer to a direction in which the channel pattern 110 extends. A second direction D2 will refer to a direction that is perpendicular to the first direction D1 and parallel to a gate line 150 (see, e.g., FIG. 19). A third direction D3 will refer to a direction that is perpendicular to the first direction D1 and the second direction D2 and perpendicular to a main (e.g., top) surface of the substrate 102.

In some embodiments, the substrate 102 may include a semiconductor including silicon (Si) or germanium (Ge), a compound semiconductor including silicon carbide (SiC), gallium arsenide (GaAs), gallium phosphide (GaP), indium arsenide (InAs), aluminum gallium nitride (AlGaN), aluminum gallium arsenide (AlGaAs), or gallium indium phosphide (GaInP), or a combination thereof. In some embodiments, the substrate 102 may be a silicon-on-insulator (SOI) substrate or an amorphous substrate.

The channel pattern 110 may be formed to extend in the first direction D1. In some embodiments, the channel pattern 110 may include the same material as the substrate 102 and be formed to protrude from the substrate 102 in the third direction D3. For example, the channel pattern 110 may have a fin shape. Further, the channel pattern 110 may be doped with n-type impurities or p-type impurities. As shown in FIG. 2, four channel patterns 110 may be formed, but the inventive concepts are not limited thereto.

The device isolation layer 120 may be formed on (e.g., to cover) a top surface of the substrate 102 and side surfaces of the channel pattern 110. Further, the device isolation layer 120 may be in (e.g., may fill) a trench between the channel patterns 110. A top end/surface of the device isolation layer 120 may be at a lower level than a top end/surface of the channel pattern 110, and the device isolation layer 120 may not cover an upper portion of the channel pattern 110. The device isolation layer 120 may include silicon oxide, silicon nitride, silicon oxynitride, or a low-k dielectric material.

The first gate insulating layer 130A and the second gate insulating layer 130B may be formed to extend in the second direction D2. The first gate insulating layer 130A and the second gate insulating layer 130B may be on (e.g., may cover) surfaces (e.g., upper surfaces) of the channel pattern 110 and the device isolation layer 120. Although the first gate insulating layer 130A and the second gate insulating layer 130B are formed in a straight line, the first gate insulating layer 130A and the second gate insulating layer 130B may be spaced apart from each other with the gate isolation layer 170 interposed therebetween. The first gate insulating layer 130A and the second gate insulating layer 130B may be formed by separating a gate insulating layer (refer to 130 in FIG. 19) that will be described below. Hereinafter, the gate insulating layer 130 will refer to the first gate insulating layer 130A and the second gate insulating layer 130B, which are formed in the straight line.

The first gate insulating layer 130A may be on (e.g., may cover) a portion of the first gate 150A. In some embodiments, the first gate insulating layer 130A may not be on (e.g., may not cover) an inner side surface IA of the first gate 150A, while the first gate insulating layer 130A may be on (e.g., may cover) a first side surface W1A and a second side surface W2A of the first gate 150A. The second gate insulating layer 130B may be on (e.g., may cover) a portion of the second gate 150B. In some embodiments, the second gate insulating layer 130B may not be on (e.g., may not cover) an inner side surface IB of the second gate 150B, while the second gate insulating layer 130B may be on (e.g., may cover) a first side surface W1B and a second side surface W2B of the second gate 150B.

Here, the inner side surface IA of the first gate 150A and the inner side surface IB of the second gate 150B may respectively refer to surfaces of the first gate 150A and the second gate 150B, which face the gate isolation layer 170. The first side surfaces W1A and W1B and the second side surfaces W2A and W2B of the first gate 150A and the second gate 150B may refer to surfaces of the first gate 150A and the second gate 150B, which are orthogonal to the first direction D1.

The first gate insulating layer 130A and the second gate insulating layer 130B may include silicon oxide, silicon nitride, a high-k dielectric material, or a combination thereof. The high-k dielectric material may include hafnium oxide ($HfO_2$), hafnium silicon oxynitride (HfSiON), hafnium titanium oxide (HfTiO), hafnium zirconium oxide (HfZrO), barium titanate ($BaTiO_3$), lanthanum oxide ($LaO_2$), titanium dioxide ($TiO_2$), tantalum pentoxide ($Ta_2O_5$), yttrium oxide ($Y_2O_3$), strontium titanate (STO), zirconium oxide, aluminum oxide, or a combination thereof.

The interlayer insulating layer 140 may be formed on the device isolation layer 120. The interlayer insulating layer 140 may be in (e.g., may fill) a space between the channel patterns 110 and spaces between the first gates 150A and the second gates 150B. The interlayer insulating layer 140 may include silicon oxide, silicon nitride, silicon oxynitride, or a low-k dielectric material.

The first gate 150A and the second gate 150B may be formed on the substrate 102 to extend in the second direction D2. The first gate 150A and the second gate 150B may be disposed across the channel pattern 110. For example, the first gate 150A and the second gate 150B may be on (e.g., may cover) top surfaces and both side surfaces of the channel patterns 110 on the device isolation layer 120.

Figure 19:
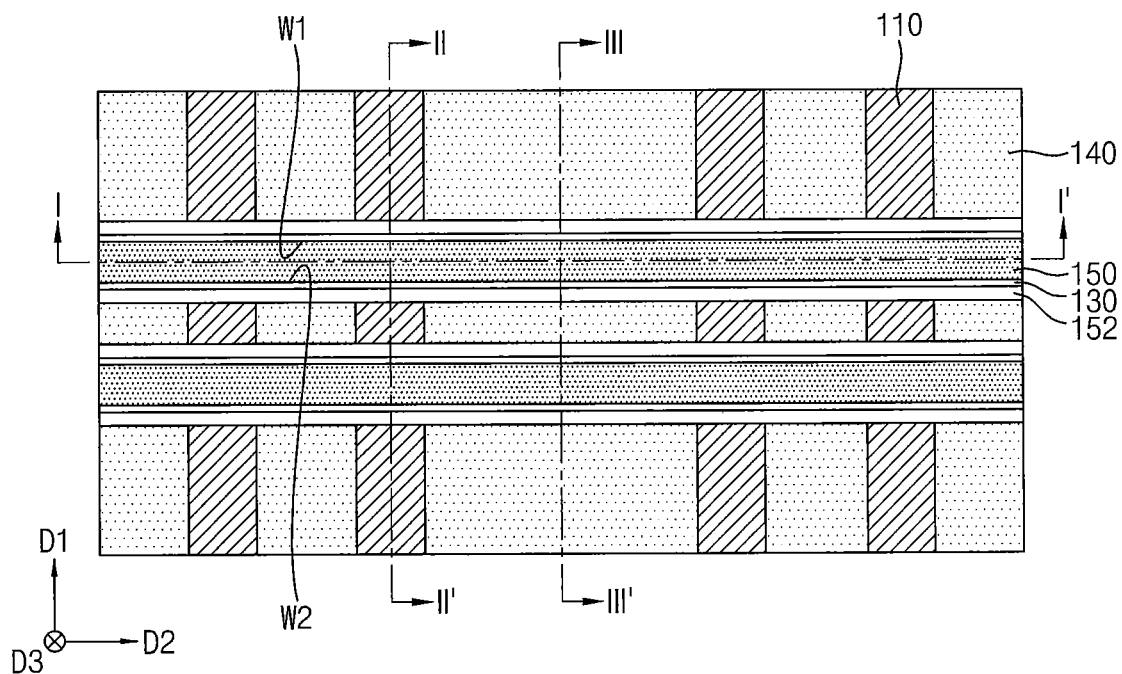

The first gate 150A and the second gate 150B may be formed by separating the gate line 150 (refer to 150 in FIG. 19). Although the first gate 150A and the second gate 150B are formed in a straight line, the first gate 150A and the second gate 150B may be disposed to be spaced apart from each other with the gate isolation layer 170 interposed therebetween. Hereinafter, the gate line 150 will be interpreted as including the first gate 150A and the second gate 150B, which are disposed in the straight line and which may be referred to herein as first and second portions of the gate line 150. The first gate 150A and the second gate 150B may be formed using a replacement metal gate (RMG) process and a gate cutting process. The first gate insulating layer 130A may not be formed on the inner side surface IA of the first gate 150A, which may be in physical contact with the gate isolation layer 170. Further, the second gate insulating layer 130B may not be formed on the inner side surface IB of the second gate 150B, which may be in physical contact with the gate isolation layer 170.

Each of the first gate 150A and the second gate 150B may include a metal. For example, each of the first gate 150A and the second gate 150B may include titanium nitride (TiN), tantalum carbide (TaC), tantalum nitride (TaN), titanium silicon nitride (TiSiN), tantalum aluminum nitride (TaAlN), tungsten nitride (WN), ruthenium (Ru), titanium aluminide (TiAl), titanium carbide (TiC), tantalum carbonitride (TaCN), tungsten (W), aluminum (Al), copper (Cu), cobalt (Co), titanium (Ti), nickel (Ni), or a combination thereof.

First gate spacers 152A and second gate spacers 152B may extend in the second direction D2 and be formed on the first side surfaces W1A and W1B and the second side surfaces W2A and W2B of the first gate 150A and the second gate 150B. As shown in FIG. 1, the first gate insulating layer 130A may be disposed between the first gate spacers 152A and the first gate 150A. Similarly, the second gate insulating layer 130B may be disposed between the second gate spacers 152B and the second gate 150B. The first gate spacers 152A may be spaced apart from the second gate spacers 152B with the gate isolation layer 170 interposed therebetween.

The first gate spacer 152A and the second gate spacer 152B may be formed by separating a gate spacer (refer to 152 in FIG. 19). The gate spacer 152 may refer to the first gate spacer 152A and the second gate spacer 152B, which are disposed in a straight line. The first gate spacer 152A and the second gate spacer 152B may include silicon nitride, silicon carbonitride, silicon oxynitride, or a combination thereof.

The first capping layer 160A and the second capping layer 160B may extend in the second direction D2 and be formed on the first gate 150A and the second gate 150B, respectively. As shown in FIG. 3, the first capping layer 160A may be disposed between the first gate spacers 152A. Similarly, the second capping layer 160B may be disposed between the second gate spacers 152B. A top surface of the first capping layer 160A and a top surface of the second capping layer 160B may be respectively at the same level as (i.e., may be coplanar with) top surfaces of the first gate spacers 152A and top surfaces of the second gate spacers 152B. The first capping layer 160A and the second capping layer 160B may be formed by separating a capping layer (refer to 160 in FIG. 20). The capping layer 160 may refer to the first capping layer 160A and the second capping layer 160B, which are disposed in a straight line. The first capping layer 160A and the second capping layer 160B may include silicon nitride, silicon oxynitride, silicon oxide, silicon carbonitride, or a combination thereof.

The gate isolation layer 170 may be disposed between the first gate 150A and the second gate 150B. The gate isolation layer 170 may be formed to pass through the capping layer 160 and extend in the third direction D3. A bottom end of the gate isolation layer 170 may be at the same level as (e.g., may physically contact) the top end of the device isolation layer 120. The gate isolation layer 170 may be in physical contact with the inner side surface IA of the first gate 150A and the inner side surface IB of the second gate 150B. An insulating material may not be disposed between the gate isolation layer 170 and the first gate 150A. Similarly, an insulating material may not be disposed between the gate isolation layer 170 and the second gate 150B.

The gate isolation layer 170 may have a first width, which may be a middle critical dimension (MCD), greater than a second width, which may be a top critical dimension (TCD), thereof. Further, the gate isolation layer 170 may have a third width, which may be a bottom critical dimension (BCD), less than the MCD thereof. The BCD of the gate isolation layer 170 may be equal to or greater than the TCD thereof. Here, the TCD may refer to a CD of a point of the gate isolation layer 170 corresponding to a bottom end of the first capping layer 160A or the second capping layer 160B, and the MCD may refer to a CD of a point of the gate isolation layer 170 between the TCD and the BCD of the gate isolation layer 170.

The gate isolation layer 170 may include silicon nitride, silicon oxynitride, silicon carbonitride, or a combination thereof. Since the MCD of the gate isolation layer 170 is greater than the TCD of the gate isolation layer 170, the gate isolation layer 170 may have a greater volume than when the gate isolation layer 170 is etched to have a uniform CD. The gate isolation layer 170 may increase an interval between the first and second gates 150A and 150B to reduce a capacitance so that the first gate 150A and the second gate 150B may be insulated from each other more effectively.

As shown in FIG. 1, the gate isolation layer 170 may be disposed in a gate cut 175 (e.g., a gate cut region). The gate cut 175 may be formed in the gate lines 150. The gate cut 175 may be formed by etching the gate lines 150 and the interlayer insulating layer 140 in the third direction D3. The gate cut 175 may be formed not only in the gate lines 150 but also in the gate insulating layer 130 and the gate spacer 152. The gate cut 175 may be formed to have a width greater than widths of the first gate 150A and the second gate 150B in the first direction D1. Thus, the gate cut 175 may be sufficiently filled with an insulating material, and a capacitance may be reduced so that the first gate 150A may be insulated from the second gate 150B more effectively.

Due to an etch selectivity between the gate line 150 and the interlayer insulating layer 140, a portion of the gate cut 175, which may overlap the gate line 150, may be formed to be larger than a portion of the gate cut 175, which may overlap the interlayer insulating layer 140. In some embodiments, as shown in FIG. 1, a first CD GC1 of the gate cut 175 formed on the gate line 150 may be greater than a second CD GC2 of the gate cut 175 formed on the interlayer insulating layer 140 between the gate lines 150. In some embodiments, when viewed from above, the gate cut 175 may have a scallop shape with a narrow portion.

The air gap 180 may be formed in the gate isolation layer 170. The air gap 180 may have a low dielectric constant and improve an insulation effect of the gate isolation layer 170. The air gap 180 may have a circular shape, an elliptical shape, or another shape. A top end TA of the air gap 180 may be at a higher level than the top end of the channel pattern 110. Although FIG. 2 illustrates an example in which the top end TA of the air gap 180 is at a lower level than top ends of the first gate 150A and the second gate 150B, in some embodiments, the top end TA of the air gap 180 may be at a higher level than the top ends of the first gate 150A and the second gate 150B. A bottom end of the air gap 180 may be at a higher level than the top end of the device isolation layer 120. The air gap 180 may have an outline similar to that of the gate isolation layer 170. As shown in FIG. 2, the air gap 180 may have an elliptical shape having a minor axis in the second direction D2.

As shown in FIG. 1, the air gap 180 may be formed at an intersection between the gate isolation layer 170 and the gate line 150. The air gap 180 may not be formed in a portion of the gate isolation layer 170 that is disposed between the interlayer insulating layers 140.

Moreover, although air gaps have been discussed herein by way of example, any gap may be used according to embodiments of the present inventive concepts. A gap may be defined, for example, as any void, cavity, or unobstructed space, and may be a gap filled with air (e.g., the air gap 180), a gap filled with an inert gas or gases (e.g., an inert gas gap), a gap defining a vacuum (e.g., a vacuum gap), etc.

FIGS. 5 to 8 are cross-sectional views according to some example embodiments. A detailed description of the same components as in FIG. 2 will be omitted.

Figure 5:
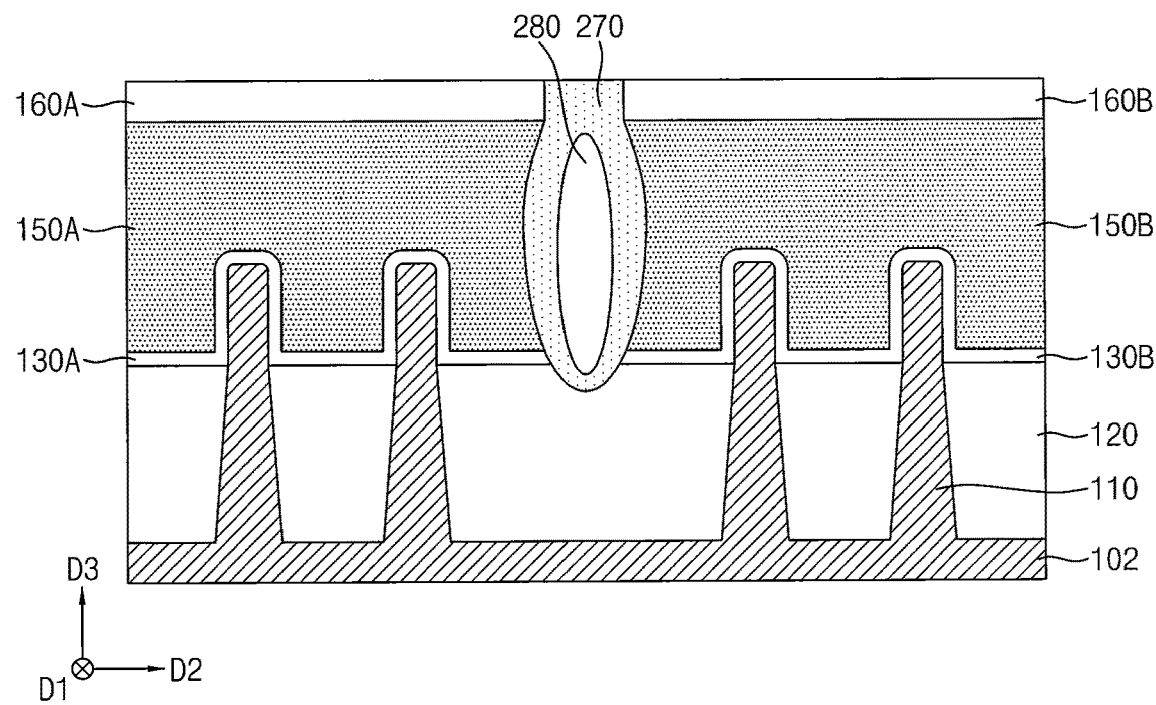
FIGS. 5 to 8 are cross-sectional views corresponding to FIG. 2, according to some example embodiments.

Referring to FIG. 5, in a semiconductor device 200 according to some example embodiments, an upper portion of a device isolation layer 120 may be partially removed to form a recess. A portion of a gate isolation layer 270 may be formed in the recess. A bottom end of the gate isolation layer 270 may be at a lower level than a top end of the device isolation layer 120. A bottom end of an air gap 280 formed in the gate isolation layer 270 may be at the same level as a top end of the device isolation layer 120 or at a lower level than the top end of the device isolation layer 120.

Since the air gap 180 is formed by leaving air in the gate isolation layer 170 during the process of filling the gate cut 175 with the gate isolation layer 170, the air gap 180 may not be formed at a bottom end of the gate isolation layer 170. However, as shown in FIG. 5, the bottom end of the gate isolation layer 270 may be formed at a lower level than the top end of the device isolation layer 120 so that the bottom end of the air gap 280 may be at the same level as or a lower level than the top end of the device isolation layer 120. The gate isolation layer 270 and the air gap 280 shown in FIG. 5 may insulate the first gate 150A and the second gate 150B from each other more effectively.

Figure 6:
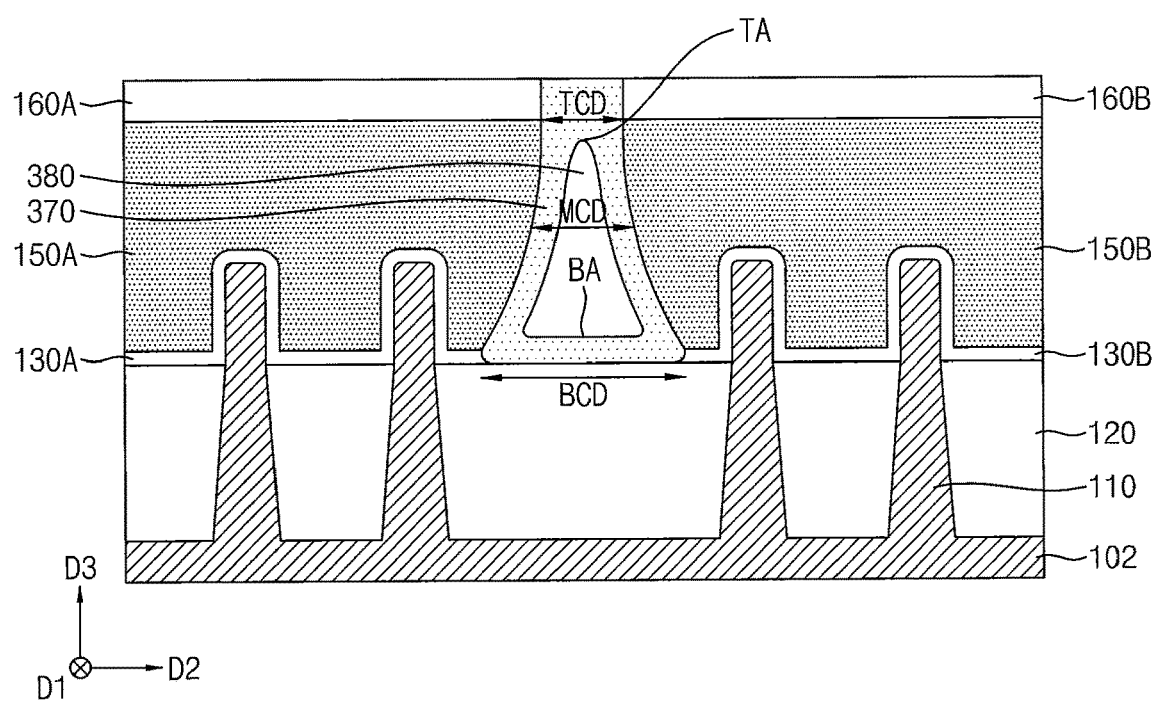

Referring to FIG. 6, in a semiconductor device 300 according to some example embodiments, a TCD of a gate isolation layer 370 may be smaller than a BCD thereof, and the BCD of the gate isolation layer 370 may be greater than a MCD thereof. For example, a CD of the gate isolation layer 370 may gradually increase from a top end of the gate isolation layer 370 toward a bottom end thereof (i.e., may be tapered from the bottom end toward the top end).

A conventional gate cut is not formed to have a uniform CD, but formed to have a gradually reduced CD according to etch depth. In this case, even if a gate isolation layer is formed, a bottom CD of the gate isolation layer may not be sufficiently great. However, when a gate isolation layer is partially etched during a gate cutting process and then a process of depositing a passivation layer and etching the passivation layer again is repeated, the bottom CD of the gate isolation layer may be increased. For example, as shown in FIG. 6, the CD of the gate isolation layer 370 may increase from the top end of the gate isolation layer 370 toward the bottom end thereof. A CD of an air gap 380 may also increase from a top end TA of the air gap 380 toward a bottom end BA thereof so that the air gap 380 may have a triangular shape. According to some embodiments, the bottom ends of the gate isolation layer 370 and the air gap 380 may be formed to be sufficiently wide so that the first gate 150A and the second gate 150B may be insulated from each other more effectively.

Figure 7:
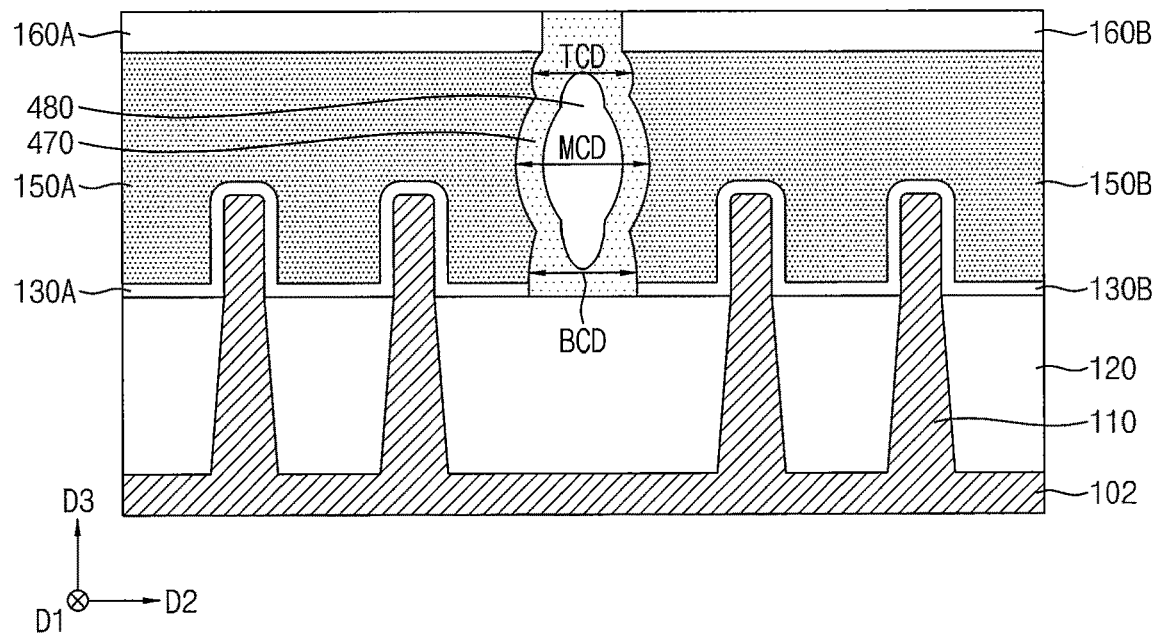

Referring to FIG. 7, in a semiconductor device 400 according to some example embodiments, a TCD of a gate isolation layer 470 may be less than a MCD thereof, and the MCD of the gate isolation layer 470 may be greater than a BCD thereof. The gate isolation layer 470 may have a narrow portion of which a CD is less than those of other portions. For example, the gate isolation layer 470 may have a scallop shape. As an example, a sidewall of the gate isolation layer 470 may include a plurality of bulges (e.g., top, middle, and bottom bulges) that bulge in the second direction D2.

The gate cutting process may further include a process of depositing a passivation layer to increase the MCD of the gate isolation layer 470. According to the above-described process, the gate isolation layer 470 may be formed to have the MCD greater than the TCD thereof so that the gate isolation layer 470 may have the scallop shape as shown in FIG. 7. Since the MCD of the gate isolation layer 470 is greater than the TCD or bottom CD thereof, the first gate 150A and the second gate 150B may be insulated from each other more effectively. Moreover, an air gap 480 may be in the gate isolation layer 470.

Figure 8:
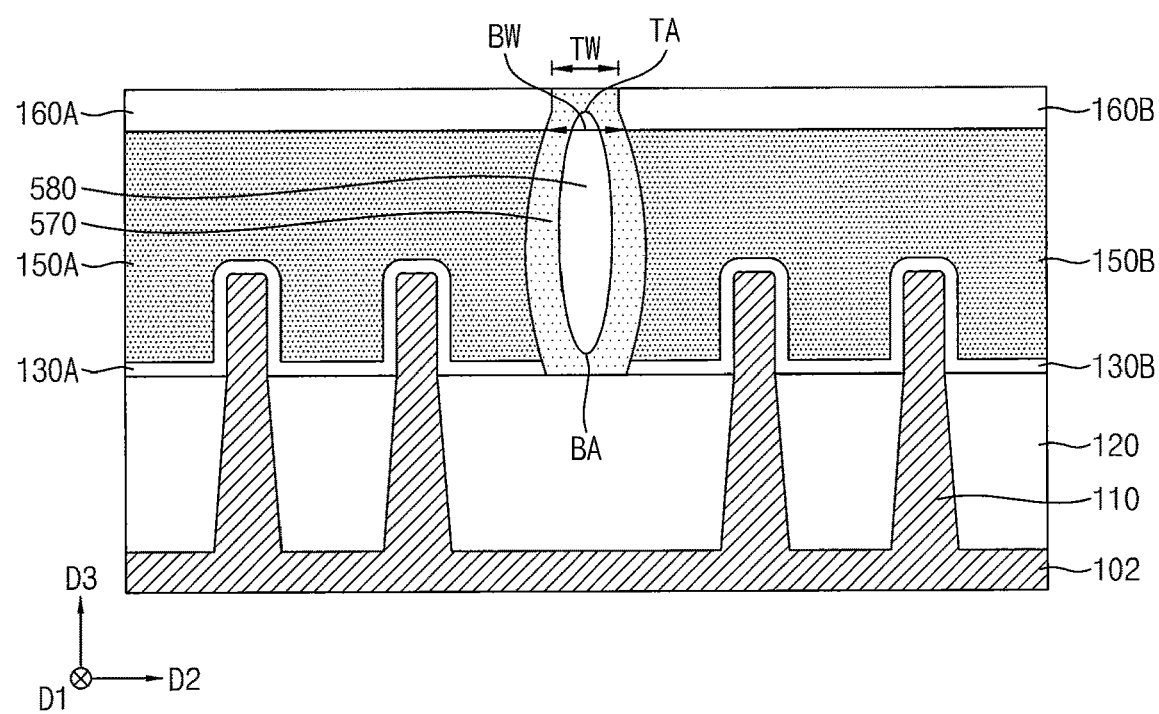

Referring to FIG. 8, in a semiconductor device 500 according to some example embodiments, an air gap 580 may be formed in a gate isolation layer 570. A top end of the air gap 580 may be at a higher level than top ends of a first gate 150A and a second gate 150B. In some embodiments, the top end of the air gap 580 may be at a higher level than bottom ends of a first capping layer 160A and a second capping layer 160B. To form the top end of the air gap 580 at a high level, a width BW between the bottom ends of the first capping layer 160A and the second capping layer 160B may be greater than a width TW between top ends of the first capping layer 160A and the second capping layer 160B.

When thicknesses of the first capping layer 160A and the second capping layer 160B are sufficiently great, even if upper portions of the first capping layer 160A and the second capping layer 160B are partially removed using a planarization process, the air gap 580 may not be exposed. As shown in FIG. 8, the air gap 580 may be formed to a higher level than the top ends of the first gate 150A and the second gate 150B so that the first gate 150A and the second gate 150B may be insulated from each other more effectively.

FIGS. 9 to 28 are cross-sectional views and plan views illustrating sequential process operations for describing a method of manufacturing a semiconductor device 100 according to some example embodiments. An example method of manufacturing the semiconductor device shown in FIGS. 1 to 4 will be described with reference to FIGS. 9 to 28.

Figure 9:
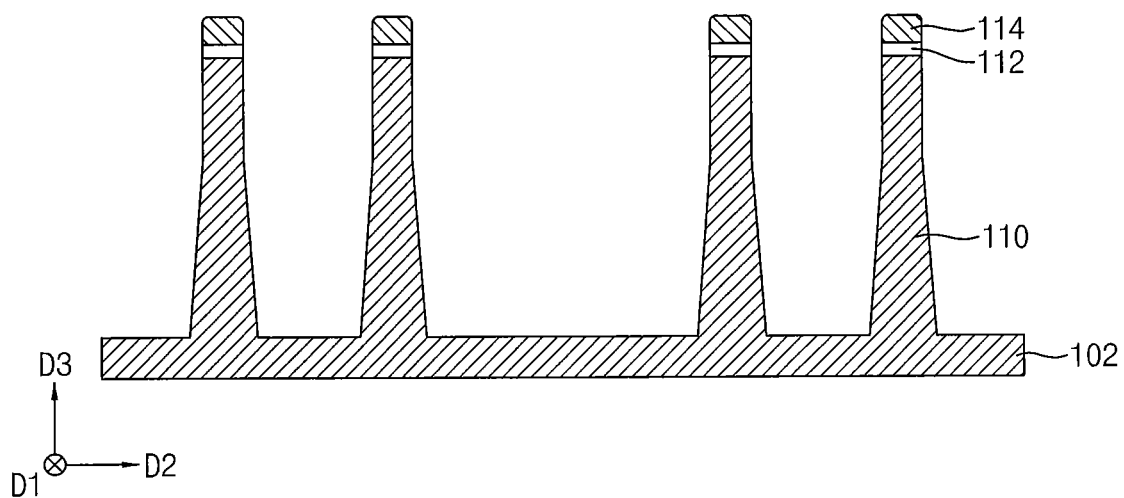

Referring to FIG. 9, a substrate 102 may be partially etched to form a channel pattern 110. The channel pattern 110 may be formed to protrude from the substrate 102 in a third direction D3 and extend in a first direction D1. A width of the channel pattern 110 may be gradually reduced upward. As shown in FIG. 9, a top end of the channel pattern 110 may have a round rectangular shape. The channel pattern 110 may be used for a p-type FinFET or an n-type FinFET.

A pad layer 112 and a mask layer 114 may be formed at a top end of the channel pattern 110. In some embodiments, the pad layer 112 may include silicon oxide. The pad layer 112 may be formed by thermally oxidizing the silicon substrate 102 or formed using a chemical vapor deposition (CVD) process. The mask layer 114 may include silicon nitride and be formed using a CVD process.

Figure 10:
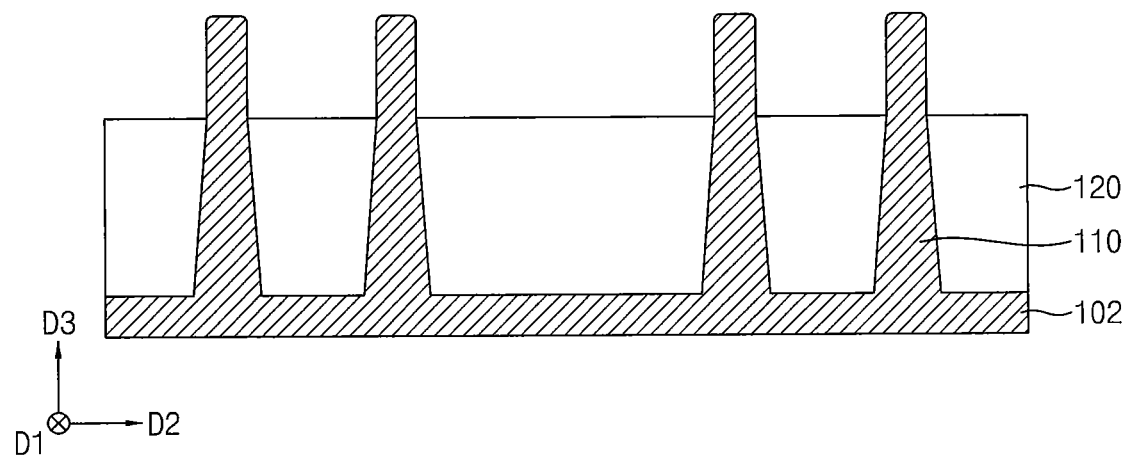

Referring to FIG. 10, a device isolation layer 120 may be formed on (e.g., to cover) a top surface of the substrate 102 and side surfaces of the channel pattern 110. The device isolation layer 120 may include silicon oxide, silicon nitride, silicon oxynitride, or a combination thereof.

In some embodiments, the device isolation layer 120 may be partially removed using an etchback process to expose an upper portion of the channel pattern 110. First, the device isolation layer 120 may be formed to completely cover the substrate 102 and the channel pattern 110. After the device isolation layer 120 is formed, a planarization operation may be performed to remove an upper portion of the device isolation layer 120 and the pad layer 112 and the mask layer 114. Next, as shown in FIG. 10, the device isolation layer 120 may be further removed/reduced to expose the upper portion of the channel pattern 110.

Figure 11:
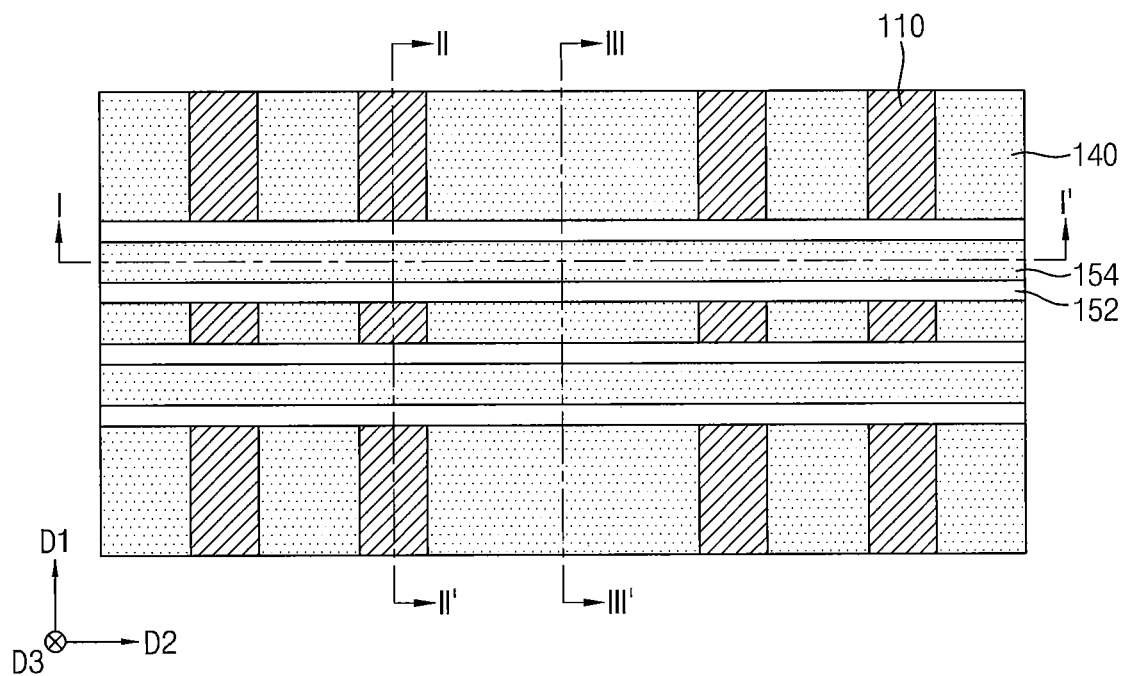
Figure 12:
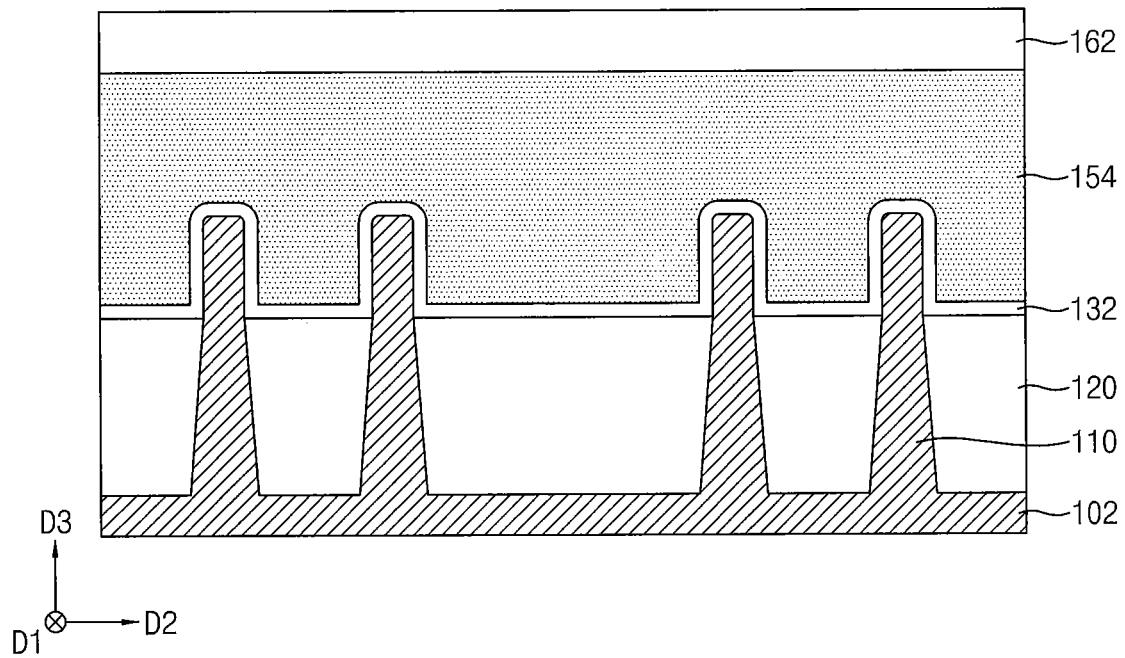
Figure 13:
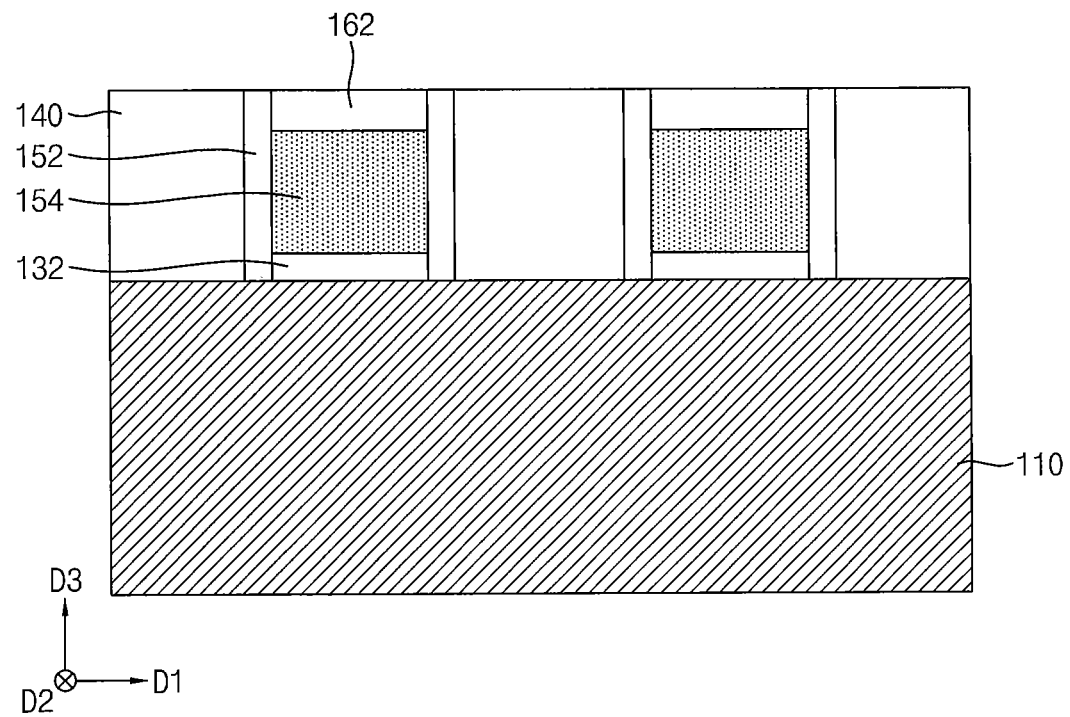
Figure 14:
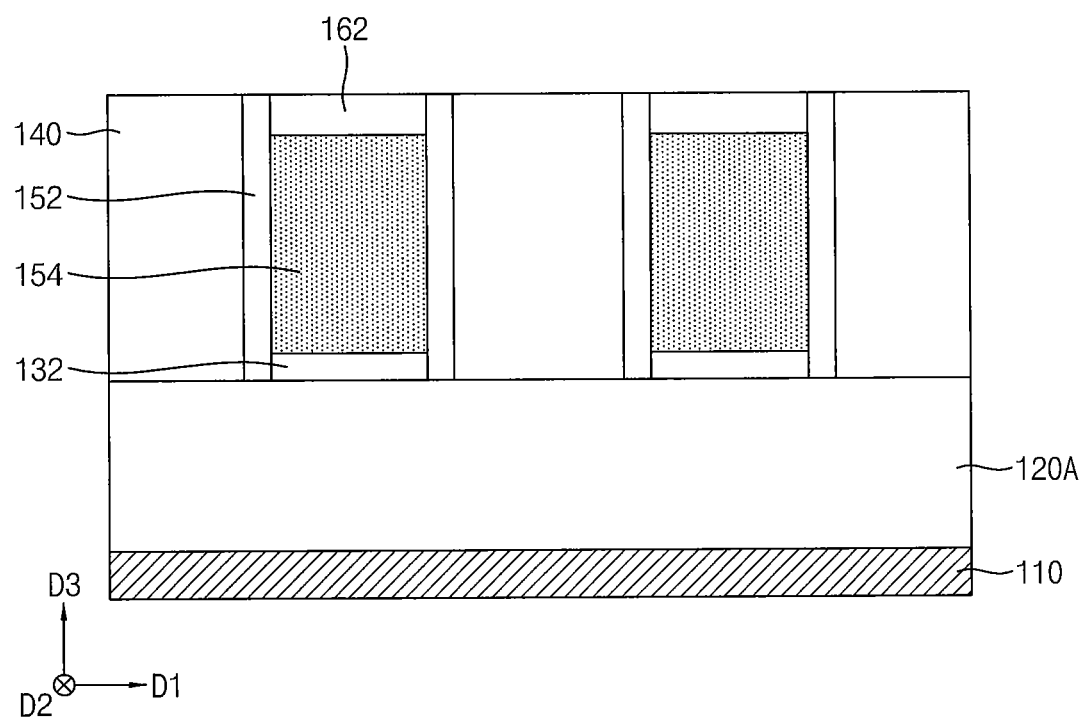

FIG. 12 is a cross-sectional view taken along line I-I' of FIG. 11. FIG. 13 is a cross-sectional view taken along line II-II' of FIG. 11. FIG. 14 is a cross-sectional view taken along line III-III' of FIG. 11.

Referring to FIGS. 11 to 14, a dummy gate structure may be formed on a channel pattern 110 and a device isolation layer 120. The dummy gate structure may include a dummy gate insulating layer 132, a dummy gate line 154, and a dummy capping layer 162. The dummy gate insulating layer 132 may include silicon oxide and be formed using a CVD process or an atomic layer deposition (ALD) process. The dummy gate line 154 may include polysilicon (poly-Si). The dummy capping layer 162 may include silicon oxide, silicon nitride, silicon oxynitride, or a combination thereof.

First, the dummy gate insulating layer 132 may be formed on the channel pattern 110 and the device isolation layer 120. Thereafter, a dummy gate line 154 and a dummy capping layer 162 may be formed on the dummy gate insulating layer 132. Gate spacers 152 may be formed on both sidewalls of the dummy gate line 154. The gate spacers 152 may include silicon nitride, silicon oxynitride, or a combination thereof.

In some embodiments, source and drain regions may be formed on both sides of the dummy gate line 154 along the channel pattern 110. The source and drain regions may be disposed at a higher level than the channel pattern 110.

First, an exposed portion of the channel pattern 110, which is not covered with the dummy gate line 154, may be removed to form a recess. Afterwards, source and drain regions may be formed in the recess using an epitaxial growth process. In some embodiments, the source and drain regions used for a p-type FinFET may include silicon germanium. Further, in some embodiments, the source and drain regions used for an n-type FinFET may include silicon carbide, silicon phosphide, or the like.

Thereafter, an interlayer insulating layer 140 may be formed on (e.g., to cover) upper portions of the channel pattern 110 and the device isolation layer 120 and a space between the dummy gate lines 154. The interlayer insulating layer 140 may include silicon oxide, silicon nitride, silicon oxynitride, or a low-k dielectric material.

Figure 15:
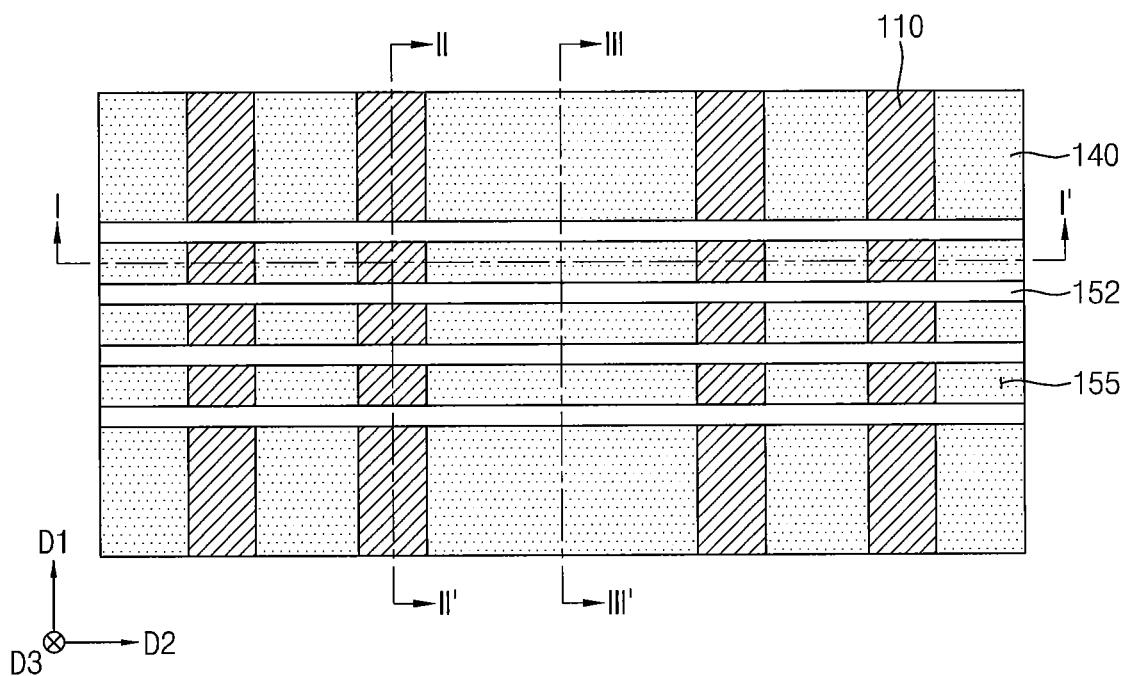
Figure 16:
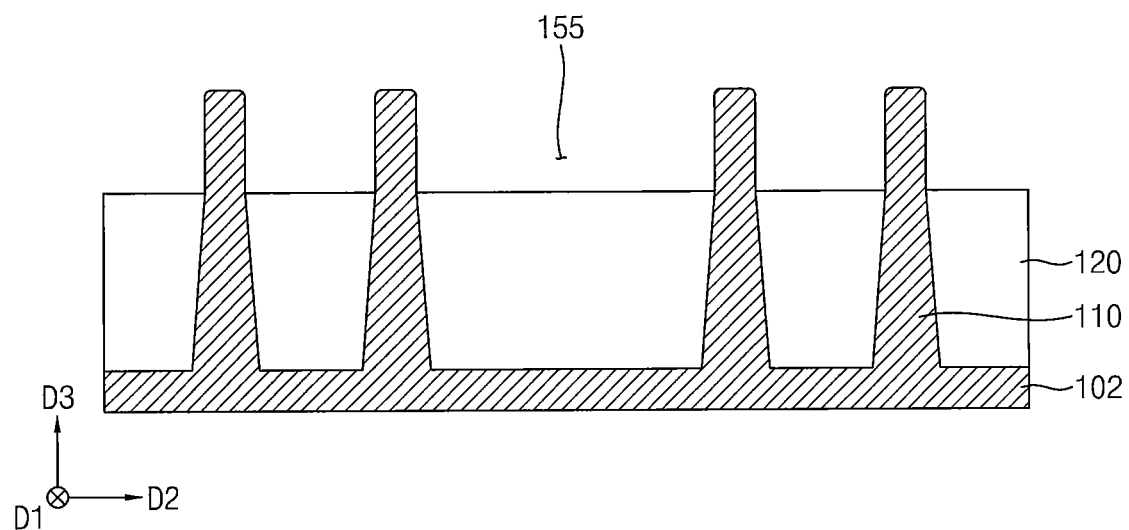
Figure 17:
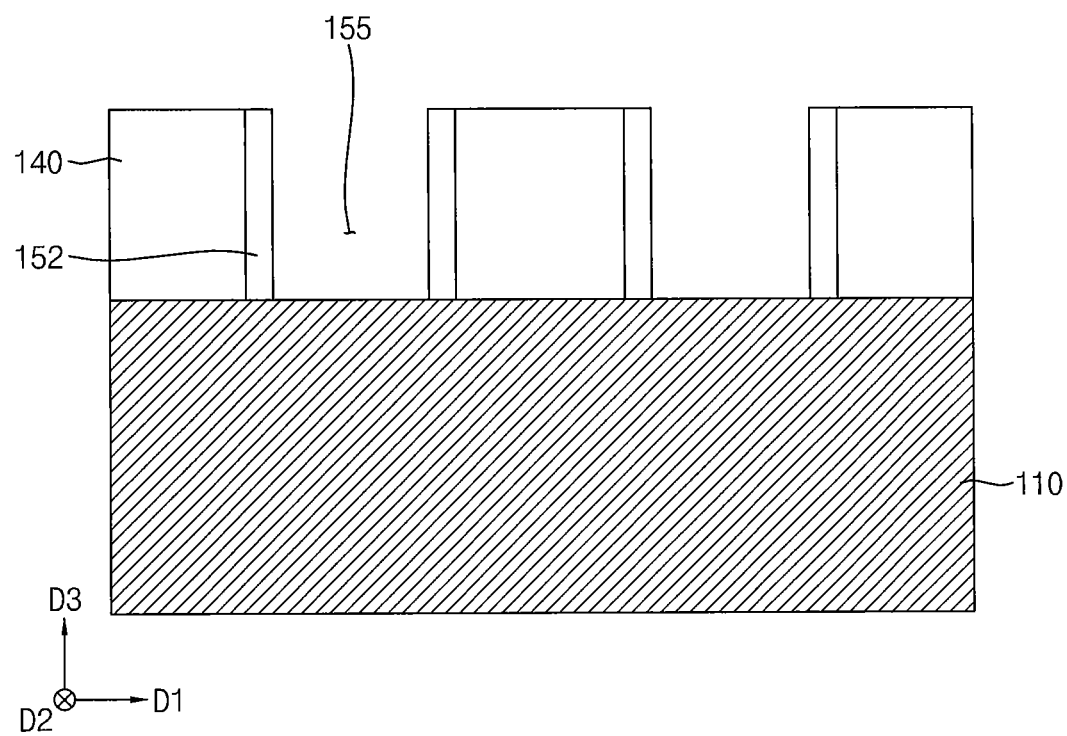
Figure 18:
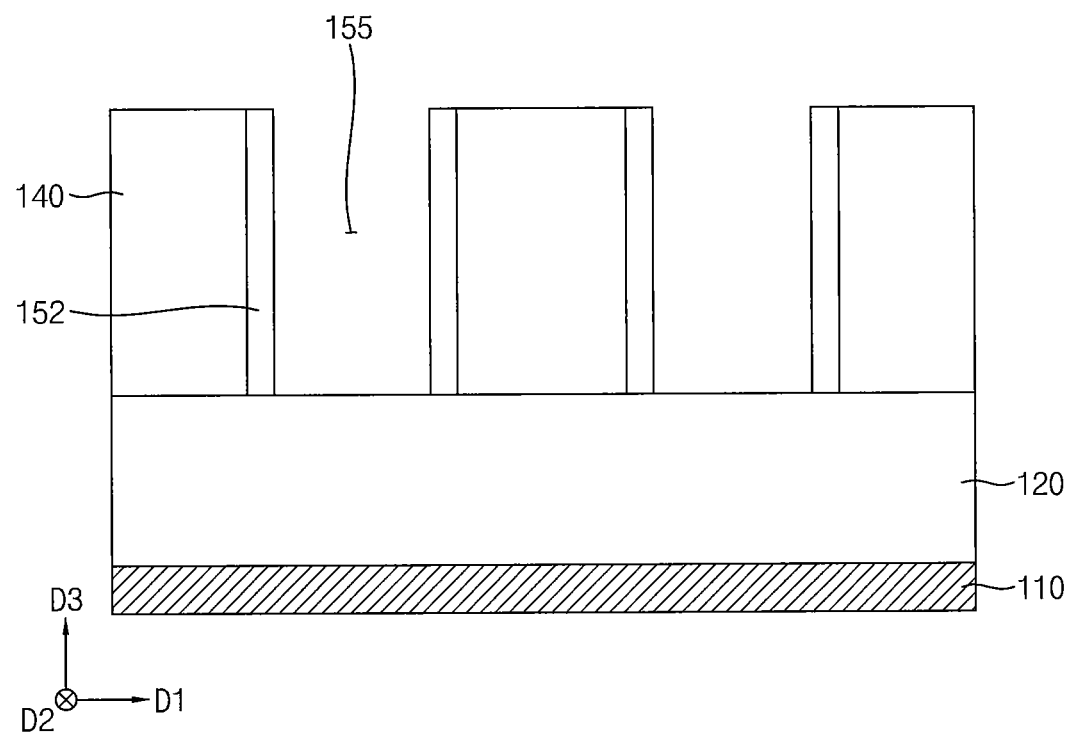

FIG. 16 is a cross-sectional view taken along line I-I' of FIG. 15. FIG. 17 is a cross-sectional view taken along line II-II' of FIG. 15. FIG. 18 is a cross-sectional view taken along line III-III' of FIG. 15.

Referring to FIGS. 15 to 18, a dummy gate insulating layer 132, a dummy gate line 154, and a dummy capping layer 162 may be removed. An interlayer insulating layer 140 and gate spacers 152 may remain. The removal process may be performed using a dry etching process or a wet etching process, and a gate opening 155 may be formed between the gate spacers 152. The removal process may be performed using a dry etching process or a wet etching process.

Figure 20:
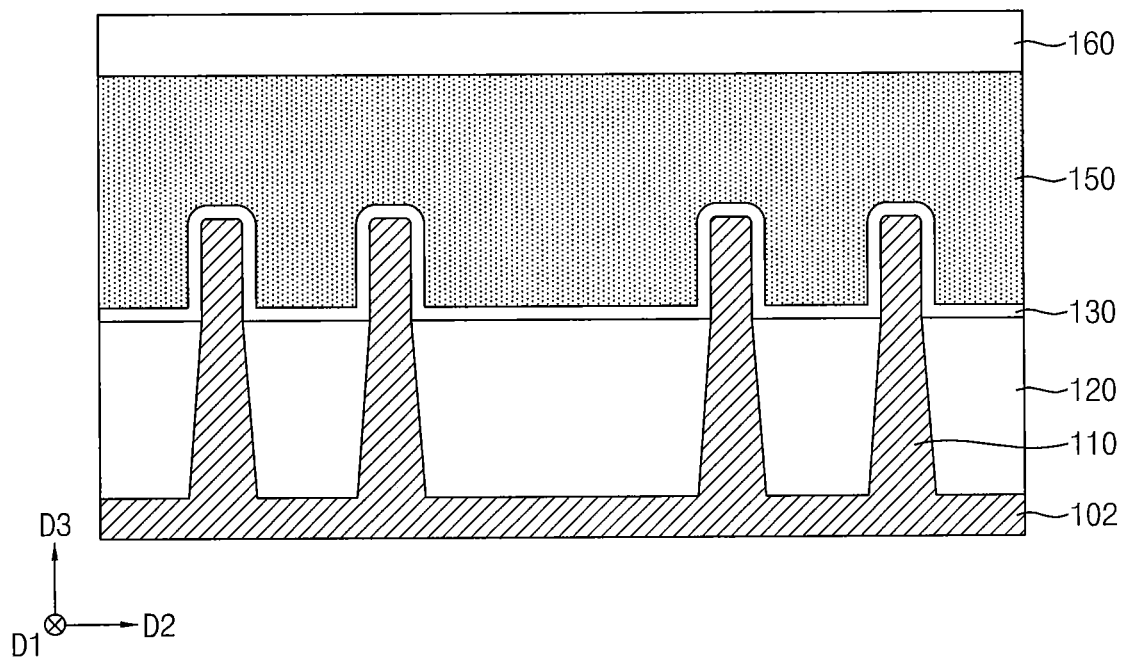
Figure 21:
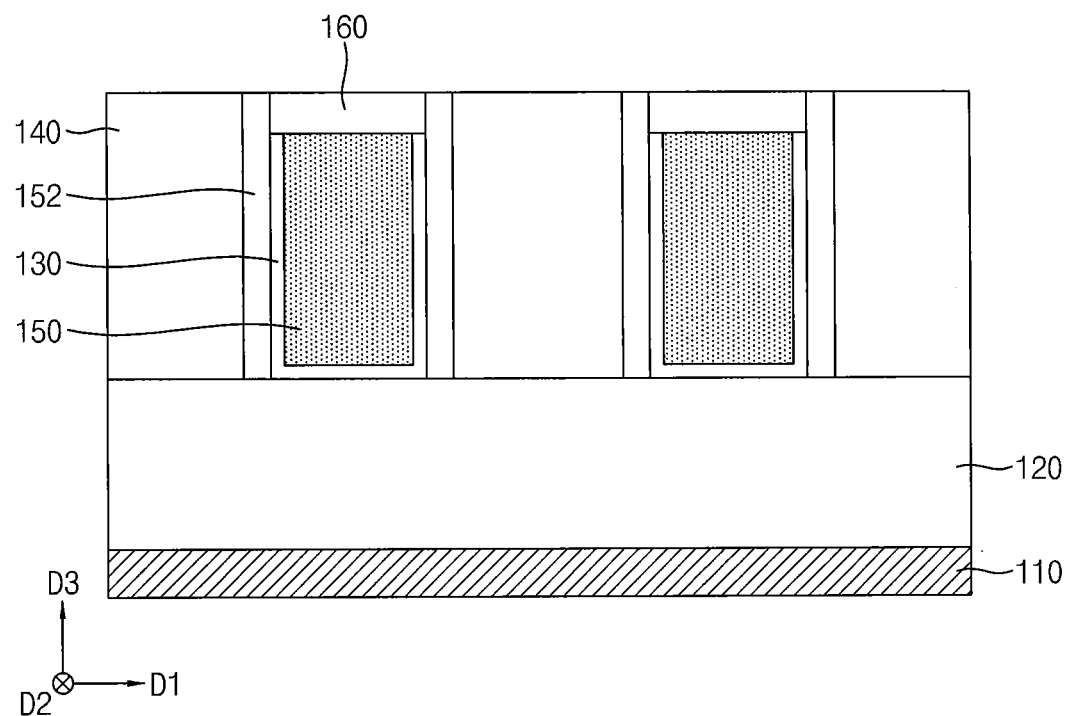

FIG. 20 is a cross-sectional view taken along line I-I' of FIG. 19. FIG. 21 is a cross-sectional view taken along line III-III' of FIG. 19.

Referring to FIGS. 19 to 21, a gate structure may be formed on a channel pattern 110 and a device isolation layer 120. The gate structure may include a gate insulating layer 130, a gate line 150, and a capping layer 160. The gate insulating layer 130 and the gate line 150 may be formed between gate spacers 152 and may be in (e.g., may fill) a gate opening 155. The gate insulating layer 130 and the gate line 150 may be formed using a CVD process, an ALD process, or a physical vapor deposition (PVD) process.

The gate insulating layer 130 may be on (e.g., may cover) top surfaces of the channel pattern 110 and the device isolation layer 120 and side surfaces of the gate spacers 152. The gate insulating layer 130 may be on (e.g., may cover) a first side surface W1 and a second side surface W2 of a gate line 150 that will be formed below.

In some embodiments, an interface layer configured to inhibit/prevent an interfacial defect may be formed between the channel pattern 110 and the gate insulating layer 130. The interface layer may be formed by thermally oxidizing the channel pattern 110 or formed using a CVD process. The interface layer may include silicon oxide, silicon oxynitride, silicate, or a combination thereof.

After the gate line 150 is deposited on the gate insulating layer 130, the gate line 150 may be partially removed using a planarization process such as a chemical mechanical polishing (CMP) process. Due to the planarization process, a top end of the gate line 150 may be at the same level as a top end of the gate spacer 152, and heights of the gate line 150 and the gate spacer 152 may be reduced.

In some embodiments, a lower portion of the gate line 150 may include a barrier layer and a work-function control layer. The barrier layer may include TiN, TaN, TiAlN, TaCN, TaC, or TaSiN. The work-function control layer may include titanium nitride (TiN), tantalum nitride (TaN), tantalum aluminum carbide (TaAlC), titanium carbide (TiC), cobalt (Co), aluminum (Al), hafnium-titanium (HfTi), titanium silicide (TiSi), or a combination thereof.

After the planarization process, an upper portion of the gate line 150 may be removed by a predetermined thickness so that a height of the gate line 150 may be lower than that of the gate spacer 152. The capping layer 160 may be formed in a space formed by removing a portion of the gate line 150. The capping layer 160 may be formed on the gate line 150 between the gate spacers 152 in a second direction D2. The capping layer 160 may be formed to have a planarized top surface.

Figure 22:
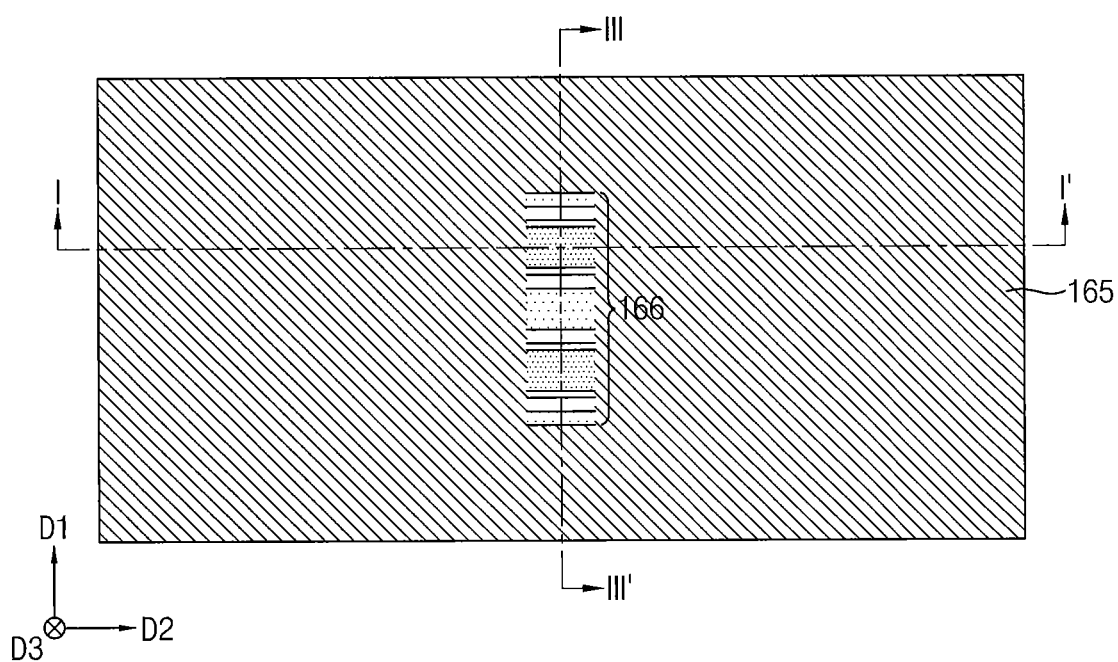
Figure 23:
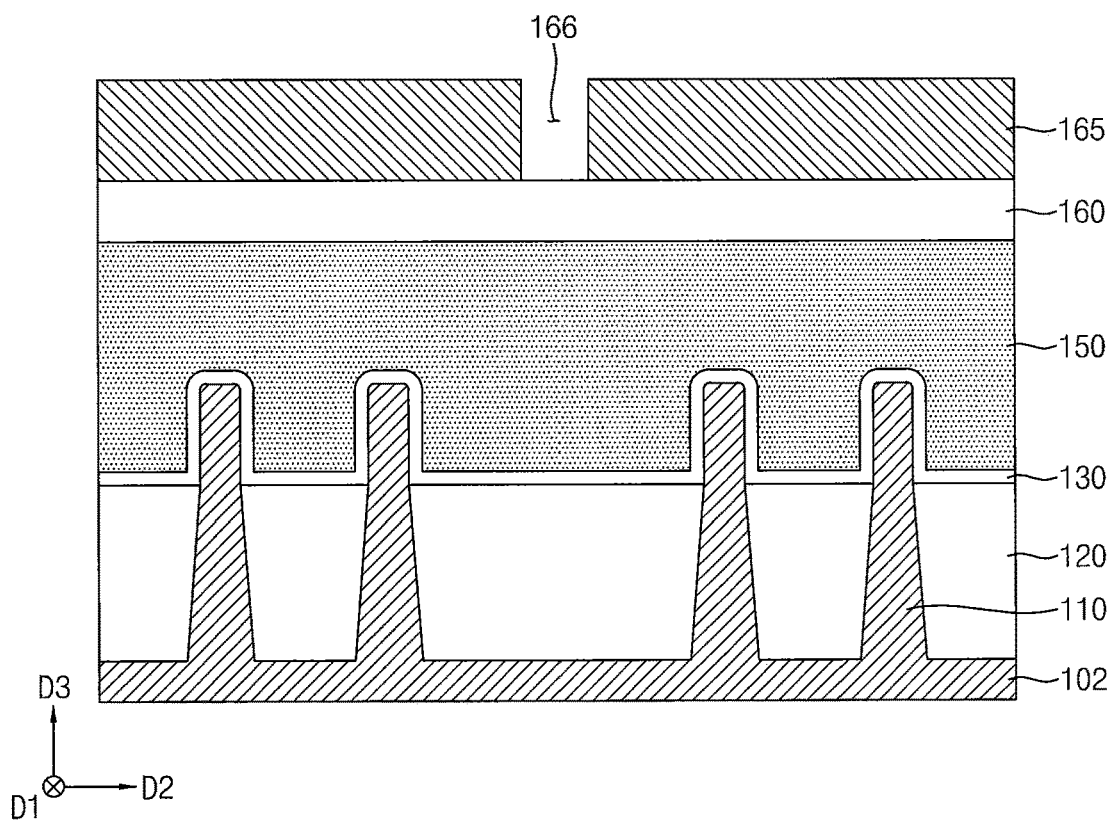
Figure 24:
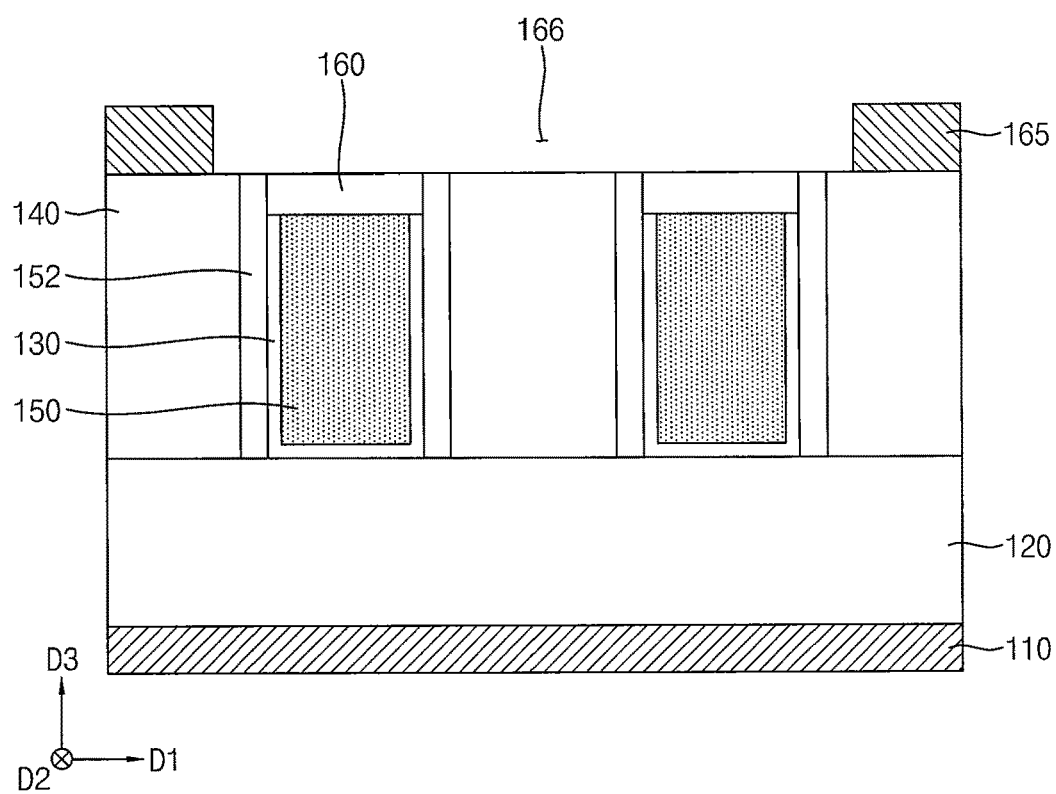

FIG. 23 is a cross-sectional view taken along line I-I' of FIG. 22. FIG. 24 is a cross-sectional view taken along line III-III' of FIG. 22.

Referring to FIGS. 22 to 24, a mask pattern 165 may be formed on the resultant structure of FIGS. 19 to 21. A mask opening 166 may be formed along the mask pattern 165 so that a capping layer 160 may be partially exposed through the mask opening 166. The mask pattern 165 may be formed along the first direction D1 so that a plurality of gate lines 150 may be etched during a gate cutting process that will be described below. As shown in FIG. 24, the mask opening 166 may be formed to sufficiently expose two gate lines 150.

The mask pattern 165 may include a material having an etch selectivity with respect to the gate line 150. For instance, the mask pattern 165 may include an oxide film, a nitride film, polysilicon (poly-Si), SOH, or a combination thereof.

Figure 25:
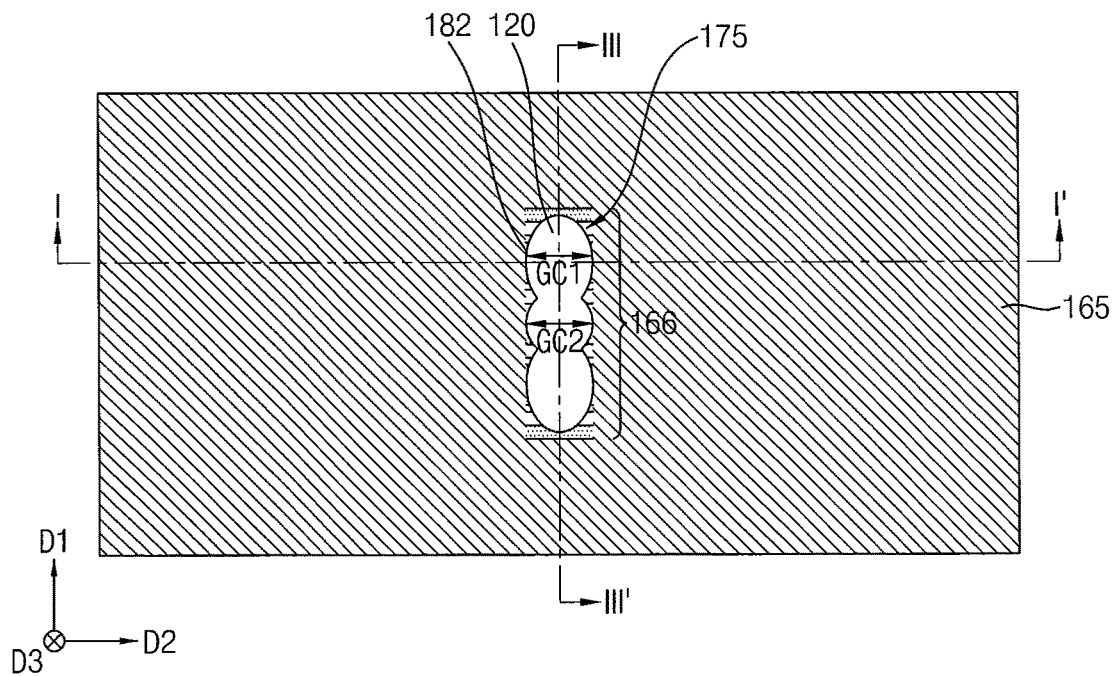
Figure 26:
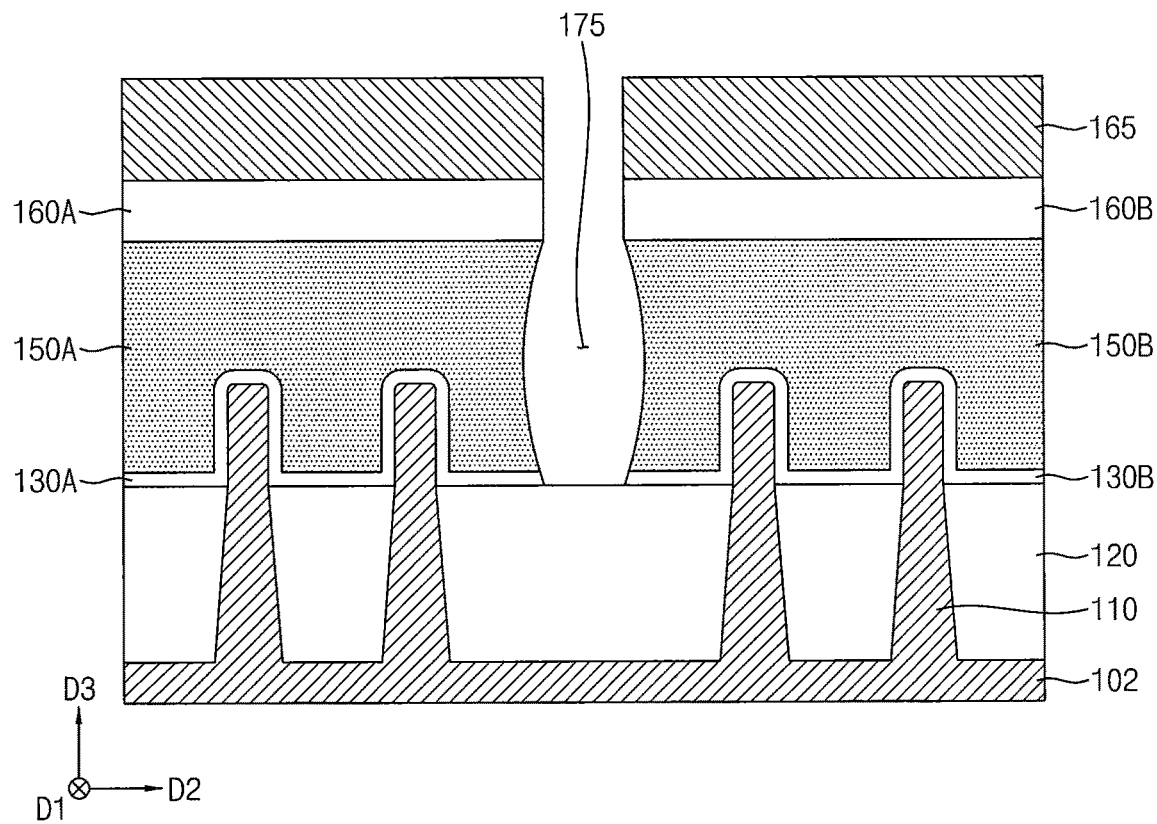
Figure 27:
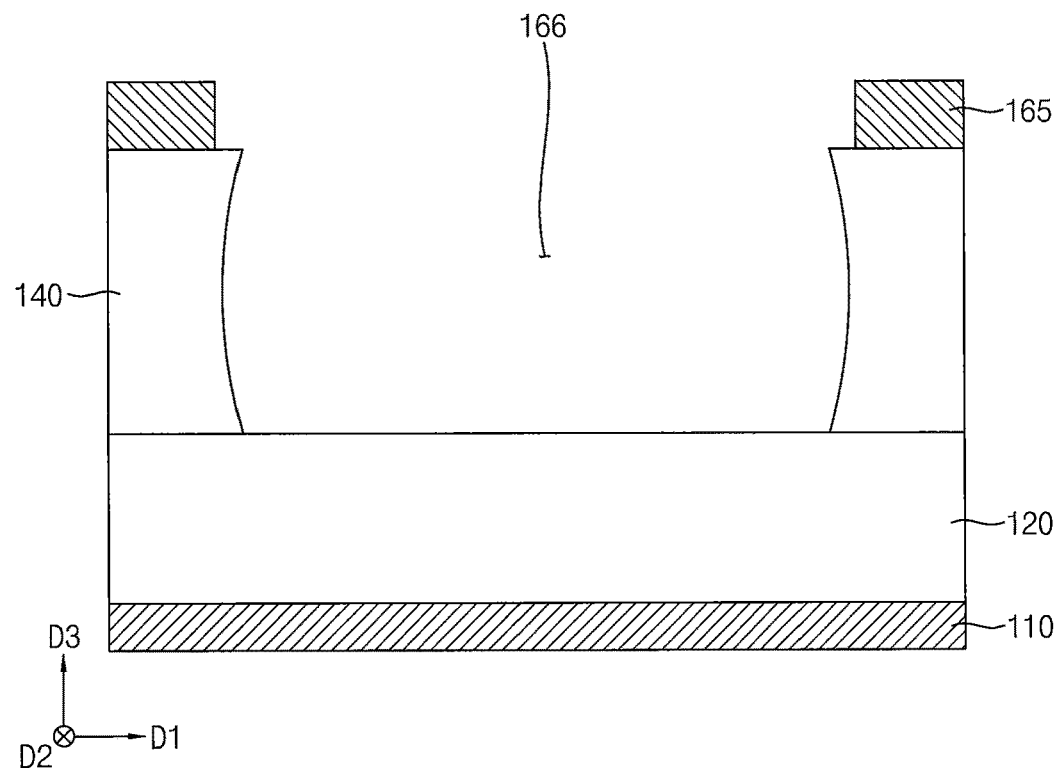

FIG. 26 is a cross-sectional view taken along line I-I' of FIG. 25. FIG. 27 is a cross-sectional view taken along line III-III' of FIG. 25.

Referring to FIGS. 25 to 27, a gate cutting process (or a gate cut forming process) may be performed along a mask opening 166. Due to the gate cutting process, a gate insulating layer 130, an interlayer insulating layer 140, a gate line 150, and the capping layer 160 may be partially removed to form a gate cut 175. Although FIG. 26 illustrates an example in which the device isolation layer 120 is not removed, in some embodiments, an upper portion of the device isolation layer 120 may be partially removed.

The gate insulating layer 130 may be separated by the gate cut 175 into a first gate insulating layer 130A and a second gate insulating layer 130B. The gate line 150 may be separated by the gate cut 175 into a first gate 150A and a second gate 150B. The capping layer 160 may be separated by the gate cut 175 into a first capping layer 160A and a second capping layer 160B.

As shown in FIG. 25, when viewed from above, the gate cut 175 may be formed in the gate lines 150 and also, formed in the gate insulating layer 130 and the gate spacer 152. Since a width of the mask pattern 165 has a width in the second direction D2 is less than a width of the mask pattern 165 in the first direction D1, a width of the gate cut 175 in the second direction D2 may be formed to be less than a width of the gate cut 175 in the first direction D1 during an etching process.

A portion of the gate cut 175, which overlaps the gate line 150, may be formed to be larger than a portion of the gate cut 175, which overlaps the interlayer insulating layer 140. In some embodiments, a first CD GC1 of the gate cut 175 formed on the gate line 150 may be greater than a second CD GC2 of the gate cut 175 formed on the interlayer insulating layer 140 between the gate lines 150. In some embodiments, when viewed from above, the gate cut 175 may have a scallop shape including a narrow portion.

In some embodiments, the gate cut 175 may be formed using a plasma etching process. In general, during the gate cutting process, the gate cut 175 may be formed to have a tapered shape so that a CD of the gate cut 175 may be reduced toward a bottom end thereof. However, in some embodiments, a process of depositing a passivation layer may be performed during the gate cutting process. First, the gate line 150 may be partially etched to form a recess, and a passivation layer may be deposited in the recess. The passivation layer may include poly-Si. Thereafter, in an etching process, sidewalls of the recess may not be removed by the passivation layer, while a bottom surface of the recess may be removed to expose a top surface of the gate line 150. A process of etching the gate line 150 may be repeated again to control a profile of the gate cut 175. The passivation layer may be removed after forming the gate cut 175.

As shown in FIG. 26, the deposition process may be performed so that a middle portion of the gate cut 175 may have a CD greater than that of an upper portion thereof. In some embodiments, in a vertical cross-sectional view, the gate cut 175 may have a scallop shape.

Figure 28:
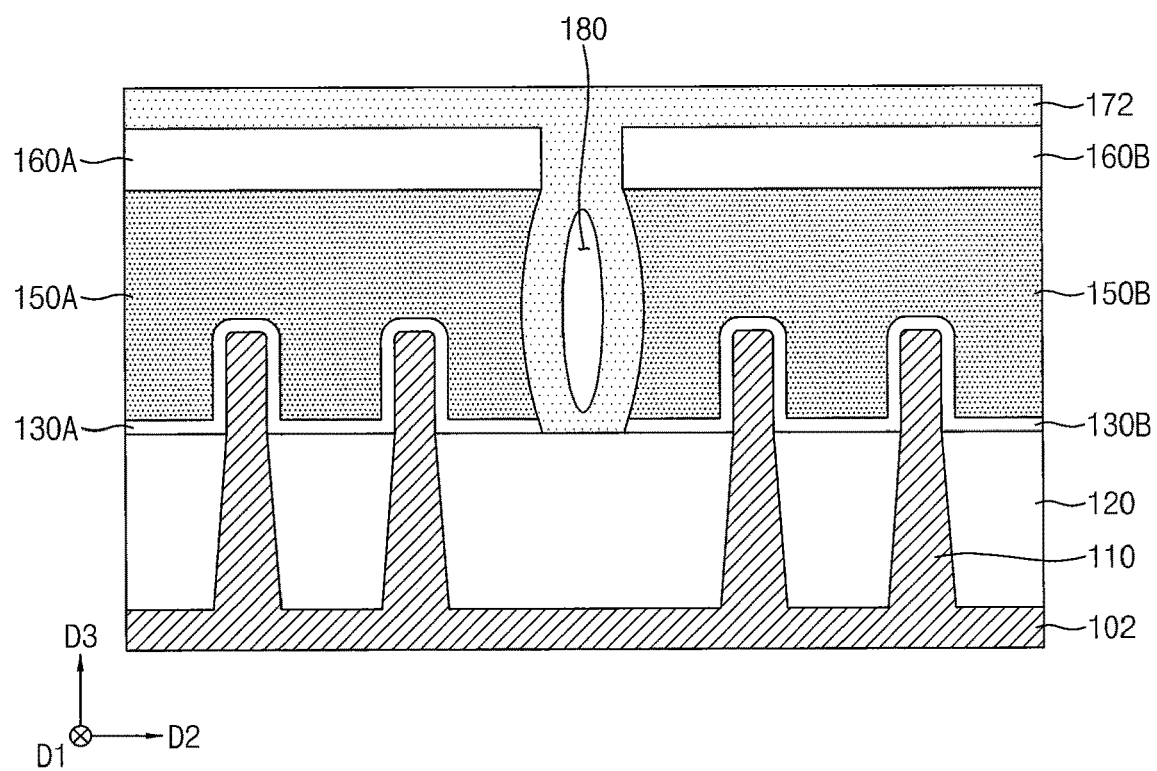

Referring to FIG. 28, an insulating layer 172 may be formed on the resultant structure of FIGS. 25 to 27. The insulating layer 172 may be formed on the interlayer insulating layer 140 and the capping layer 160. The insulating layer 172 may be formed using a CVD process or an ALD process and may be in (e.g., may fill) the inside of the gate cut 175. As shown in FIG. 28, in a vertical cross-sectional view, since a TCD of the gate cut 175 is less than a MCD thereof, an air gap 180 may be formed in the gate cut 175 during a deposition process. The first gate 150A and the second gate 150B may be efficiently/sufficiently insulated from each other by the air gap 180.

Referring to FIG. 2, after the insulating layer 172 is formed, an etchback process or a planarization process may be used to expose the interlayer insulating layer 140, the first capping layer 160A, and the second capping layer 160B. A gate isolation layer 170 may thereby be formed in the gate cut 175. Due to the etchback process or the planarization process, upper portions of the interlayer insulating layer 140 and the capping layer 160 may be partially removed.

FIGS. 29 to 32 are plan views of the semiconductor device of FIG. 1, according to some example embodiments. A detailed description of the same components as in FIG. 1 will be omitted.

Figure 29:
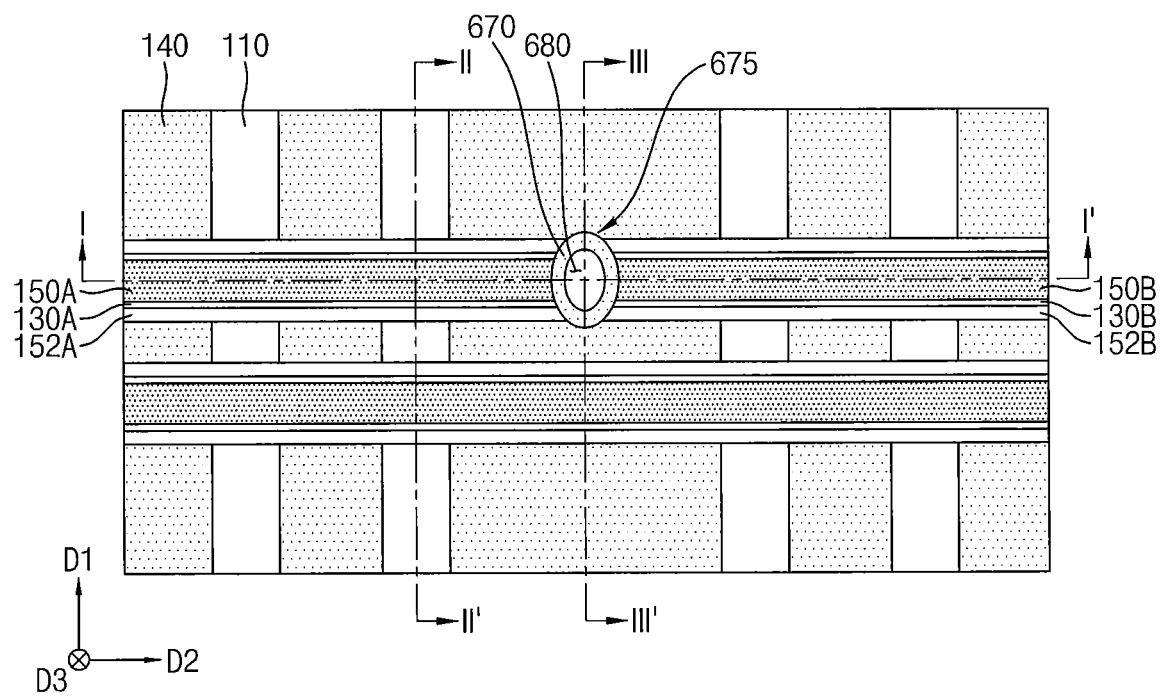
FIGS. 29 to 32 are cross-sectional views corresponding to FIG. 1, according to some example embodiments.

Referring to FIG. 29, a gate cut 675 may be formed in one gate line 150. The gate cut 675 may be formed by partially etching a gate insulating layer 130 and a gate spacer 152. A gate isolation layer 670 may be formed in the gate cut 675, and the gate isolation layer 670 may include an air gap 680. The gate cut 675 may have an elliptical shape having a major axis in a first direction D1.

Figure 30:
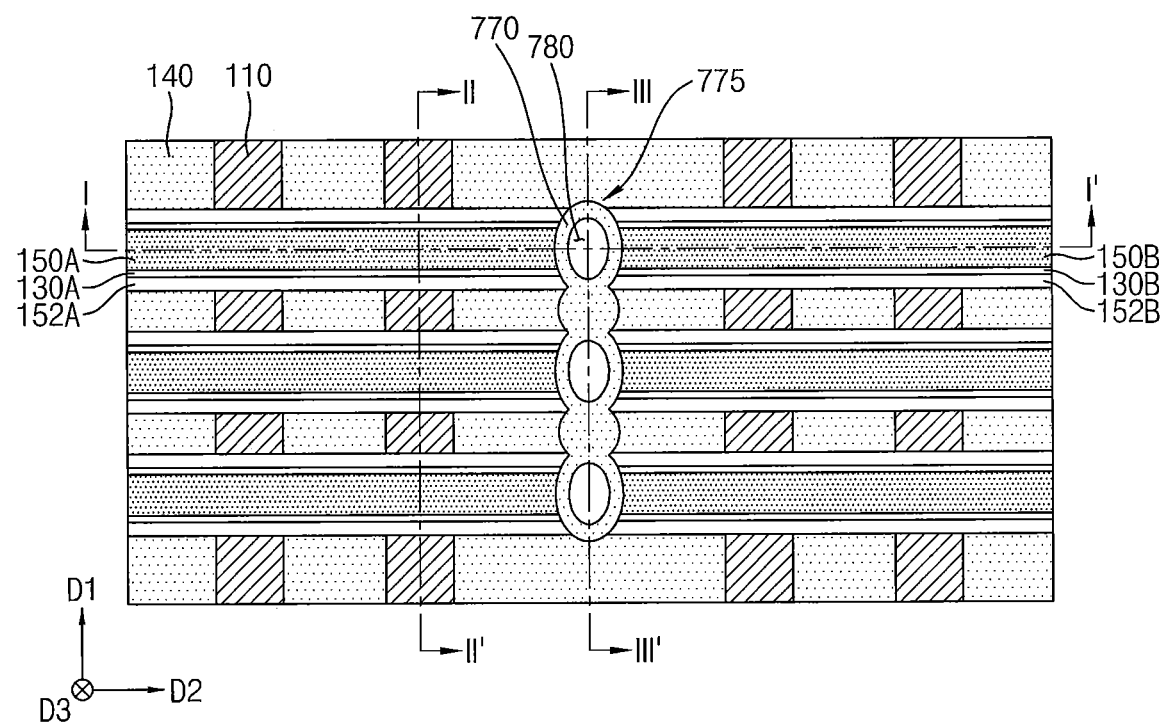

Referring to FIG. 30, three gate lines 150 may extend in a second direction D2 and be formed to be apart from each other. A gate cut 775 may extend in the first direction D1 and be disposed over the three gate lines 150. The three gate lines 150 may be etched using one gate cutting process. The gate cut 775 may have a scallop shape including a narrow shape. A gate isolation layer 770 may be formed in the gate cut 775. An air gap 780 may be formed in the gate isolation layer 770, and the air gap 780 may be formed at an intersection between the gate line 150 and the gate isolation layer 770.

Figure 31:
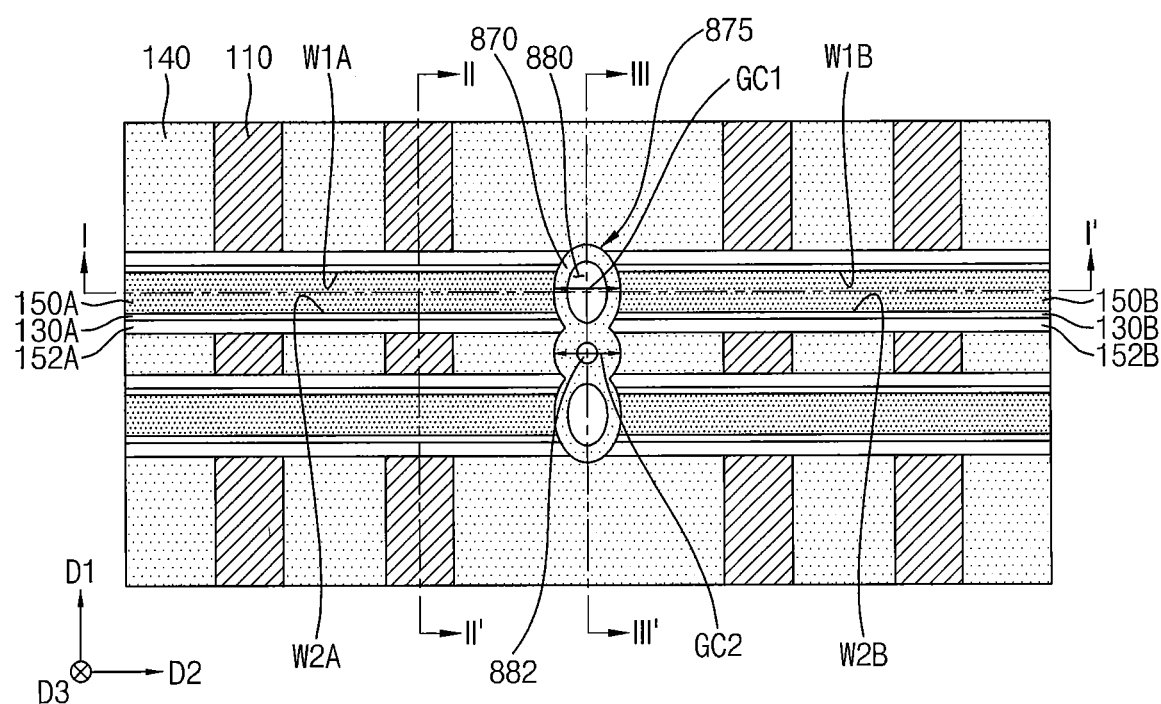

Referring to FIG. 31, a gate cut 875 may include a gate isolation layer 870, which may include an air gap 880. The gate isolation layer 870 may further include an air gap 882. The air gap 882 may be formed in a portion of the gate cut 875, which overlaps an interlayer insulating layer 140. During a process of forming the gate cut 875, not only gate lines 150 but also the interlayer insulating layer 140 may be partially etched. An air gap 882 may be formed during a process of depositing the gate isolation layer 870 in the interlayer insulating layer 140.

Figure 32:
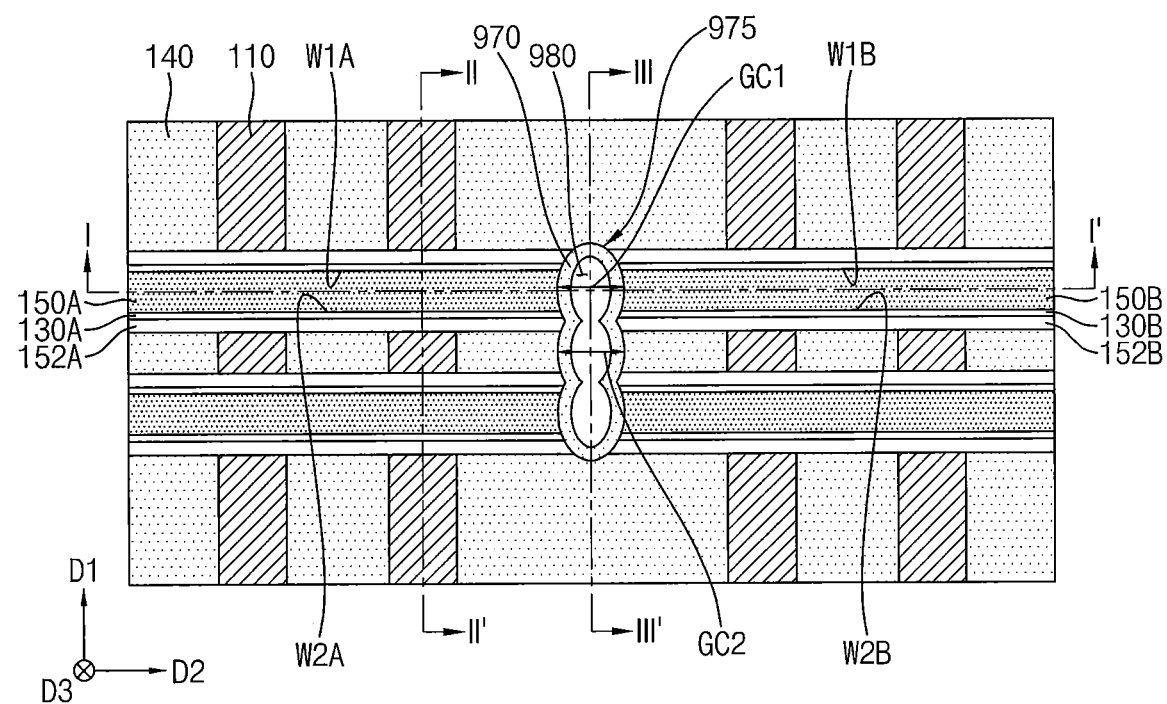

Referring to FIG. 32, a gate cut 975 may include a gate isolation layer 970, which may include an air gap 980. The air gap 980 may be formed in gate lines 150 and an interlayer insulating layer 140. The air gap 980 may be formed during a process of depositing the gate isolation layer 970 in the gate lines 150 and the interlayer insulating layer 140, which are partially etched.

According to example embodiments, in a semiconductor device including gate lines formed using an RMG process, an air gap can be formed in a process of forming a gate isolation layer to electrically insulate gate lines separated after a gate cutting process, thereby further reducing a capacitance.

According to example embodiments, a CD of the gate isolation layer may be controlled such that a CD of a top end of the gate isolation layer is smaller than that of a middle portion of the gate isolation layer. Thus, volumes of the gate isolation layer and the air gap may be increased to improve an insulation effect.

While example embodiments of the inventive concepts have been described with reference to the accompanying drawings, it should be understood by those skilled in the art that various modifications may be made without departing from the scope of the inventive concepts. Therefore, the above-described embodiments should be considered in a descriptive sense only and not for purposes of limitation.

What is claimed is:

1. A semiconductor device comprising:
    a first channel region and a second channel region that protrude from a substrate and that extend in a first direction;
    a first gate on the first channel region;
    a second gate on the second channel region, wherein the first gate and the second gate extend in a second direction intersecting the first direction and are spaced apart from each other in the second direction;
    a first gate insulating layer between the first gate and the first channel region;
    a second gate insulating layer between the second gate and the second channel region; and
    a gate isolation layer between the first gate and the second gate,
    wherein the gate isolation layer is in contact with the first gate and the second gate and comprises a gap that is in the gate isolation layer,
    wherein a first width of the gate isolation layer in the second direction is greater than a second width of the gate isolation layer in the second direction,
    wherein a third width of the gate isolation layer in the second direction is less than the first width of the gate isolation layer,
    wherein the first width is between the second width and the third width in a vertical direction,
    wherein the second width is at a level that is coplanar with an upper surface of the first gate, and
    wherein the gate isolation layer monotonically decreases in width from the first width to the second width.

2. The semiconductor device of claim 1,
    wherein the first gate insulating layer and the second gate insulating layer are spaced apart from each other with the gate isolation layer therebetween, and
    wherein the gate isolation layer is in contact with the first gate and the second gate at each of the first width, the second width, and the third width.

3. The semiconductor device of claim 1, wherein a top end of the gap is at a higher level than a top end of the first channel region.

4. The semiconductor device of claim 1,
    wherein the first gate insulating layer is on a first side surface and a second side surface of the first gate, and
    wherein the second gate insulating layer is on a first side surface and a second side surface of the second gate.

5. The semiconductor device of claim 1, further comprising a device isolation layer that is in a trench between the first channel region and the second channel region,
    wherein the first gate insulating layer is between the first gate and the device isolation layer,
    wherein the second gate insulating layer is between the second gate and the device isolation layer,
    wherein an upper portion of the device isolation layer comprises a recess,
    wherein a portion of the gate isolation layer is in the recess, and
    wherein a bottom end of the gate isolation layer is at a lower level than a top end of the device isolation layer.

6. The semiconductor device of claim 5, wherein a bottom end of the gap is at a lower level than the top end of the device isolation layer.

7. The semiconductor device of claim 1,
    wherein the gap comprises an air gap that has an elliptical shape, and
    wherein a middle portion of the air gap is wider in the second direction than upper and lower portions of the air gap.

8. The semiconductor device of claim 1, wherein, when viewed in a vertical cross-section, a sidewall of the gate isolation layer comprises a plurality of bulges.

9. The semiconductor device of claim 1, further comprising a first capping layer and a second capping layer on the first gate and the second gate, respectively, the first capping layer and the second capping layer being spaced apart from each other in the second direction with the gate isolation layer therebetween,
    wherein a width between respective bottom ends of the first capping layer and the second capping layer is greater than a width between respective top ends of the first capping layer and the second capping layer, and a top end of the gap is at a higher level than the bottom end of the first capping layer and the bottom end of the second capping layer.

10. A semiconductor device comprising:
    a substrate comprising a channel region that protrudes from the substrate;
    a gate line on a first side surface and a second side surface of the channel region;
    gate spacers on a first side surface and a second side surface of the gate line; and
    a gate isolation layer in a gate cut region that separates a first portion of the gate line from a second portion of the gate line,
    wherein the gate isolation layer is in contact with the gate line and comprises a gap that is in the gate isolation layer,
    wherein a first width of the gap is greater than a second width of the gap,
    wherein a third width of the gap is narrower than the first width,
    wherein the first width is between the second width and the third width,
    wherein a first distance between the first and second portions of the gate line at a middle portion of the gate isolation layer is greater than a second distance between the first and second portions of the gate line adjacent a top end of the gate isolation layer,
    wherein the gate line comprises one among a plurality of gate lines spaced apart from each other in a first direction that intersects a second direction in which the first portion of the gate line is separated from the second portion of the gate line, wherein the gate cut region extends in the first direction into at least two of the plurality of gate lines, wherein the gate isolation layer extends in the first direction in the gate cut region, wherein the gap is at an intersection between the gate isolation layer and the gate line, and wherein a portion of the gate cut region that is between the at least two of the plurality of gate lines increases in width toward a middle of the portion of the gate cut region.

11. The semiconductor device of claim 10, wherein the gate cut region separates the gate spacers.

12. The semiconductor device of claim 10, wherein the gate cut region has an elliptical shape.

13. The semiconductor device of claim 10, further comprising a gate insulating layer between the gate line and the gate spacers.

14. The semiconductor device of claim 10, wherein a first width of the gate cut region in the gate line is greater than a second width of the gate cut region between the at least two of the plurality of gate lines.

15. The semiconductor device of claim 10,
wherein a top end of the gap is at a higher level than a top end of the channel region, and
wherein the gap extends a majority of a height of the gate cut region.

16. The semiconductor device of claim 10,
wherein the gap comprises an air gap that has an elliptical shape, and
wherein a middle portion of the air gap is wider than upper and lower portions of the air gap.

17. A semiconductor device comprising:
a substrate comprising a channel region that protrudes from the substrate and that extends in a first direction;
a first gate line and a second gate line that are on the channel region and that extend in a second direction intersecting the first direction, wherein the first gate line is spaced apart from the second gate line in the first direction;
gate spacers on a first side surface and a second side surface of the first gate line;
a gate insulating layer between the first gate line and the gate spacers;
a gate isolation layer in a gate cut region that is between the first gate line and the second gate line in the first direction; and
a gap in the gate isolation layer, wherein the gate cut region separates the first gate line, separates the gate insulating layer, and separates the gate spacers,
wherein the gate isolation layer is in contact with the first gate line,
wherein a first width of the gate isolation layer is greater than, and located between in a vertical third direction, a second width and a third width of the gate isolation layer, and
wherein the first width is halfway between, in the vertical third direction, a level of an upper surface of the first gate line and a level of a lower surface of the first gate line.

18. The semiconductor device of claim 17, wherein the gap comprises an air gap that has an elliptical shape having a minor axis in the second direction.

19. The semiconductor device of claim 1, wherein the first width is at a level that is adjacent an upper surface of the first channel region.

20. The semiconductor device of claim 10, wherein the first width is at a level that is adjacent an upper surface of the channel region.

* * * * *